United States Patent [19]
Ito et al.

[11] Patent Number: 5,416,351
[45] Date of Patent: May 16, 1995

[54] ELECTROSTATIC DISCHARGE PROTECTION

[75] Inventors: Akira Ito, Palm Bay; Michael D. Church, Sebastian, both of Fla.

[73] Assignee: Harris Corporation, Melbourne, Fla.

[21] Appl. No.: 984,187

[22] Filed: Nov. 20, 1992

Related U.S. Application Data

[63] Continuation-in-part of Ser. No. 785,400, Oct. 30, 1991, and a continuation-in-part of Ser. No. 917,635, Jul. 20, 1992.

[51] Int. Cl.$^6$ .............................................. H01L 29/90
[52] U.S. Cl. ................................... 257/357; 257/371; 257/603; 257/360
[58] Field of Search ............... 257/355, 356, 360, 361, 257/362, 173, 175, 603, 606, 357

[56] References Cited

U.S. PATENT DOCUMENTS

| | | | |
|---|---|---|---|
| 4,990,976 | 2/1991 | Hattori | 257/379 |
| 5,001,073 | 3/1991 | Huie | 437/31 |
| 5,162,966 | 11/1992 | Fujihira | 257/360 |
| 5,204,541 | 4/1993 | Smayling et al. | 257/138 |
| 5,235,201 | 8/1993 | Honna | 257/357 |
| 5,272,097 | 12/1993 | Shiota | 257/357 |

FOREIGN PATENT DOCUMENTS

| | | | |
|---|---|---|---|
| 0058557 | 10/1982 | European Pat. Off. | 257/355 |
| 0130554 | 5/1989 | Japan | 257/355 |
| 0312268 | 12/1990 | Japan | 257/357 |
| 0139880 | 6/1991 | Japan | 257/357 |

*Primary Examiner*—Robert P. Limanek
*Assistant Examiner*—Alexander Oscar Williams
*Attorney, Agent, or Firm*—Nixon, Hargrave, Devans & Doyle

[57] ABSTRACT

An ESD protection diode for a CMOS or BiCMOS integrated circuit formed by imbedding a Zener diode in the drain of a MOS device used as a protection diode. The Zener diode may be formed with the preexisting process steps of a BiCMOS process, and it provides a low voltage trigger for avalanche breakdown in the MOS ESD protection diode.

13 Claims, 34 Drawing Sheets

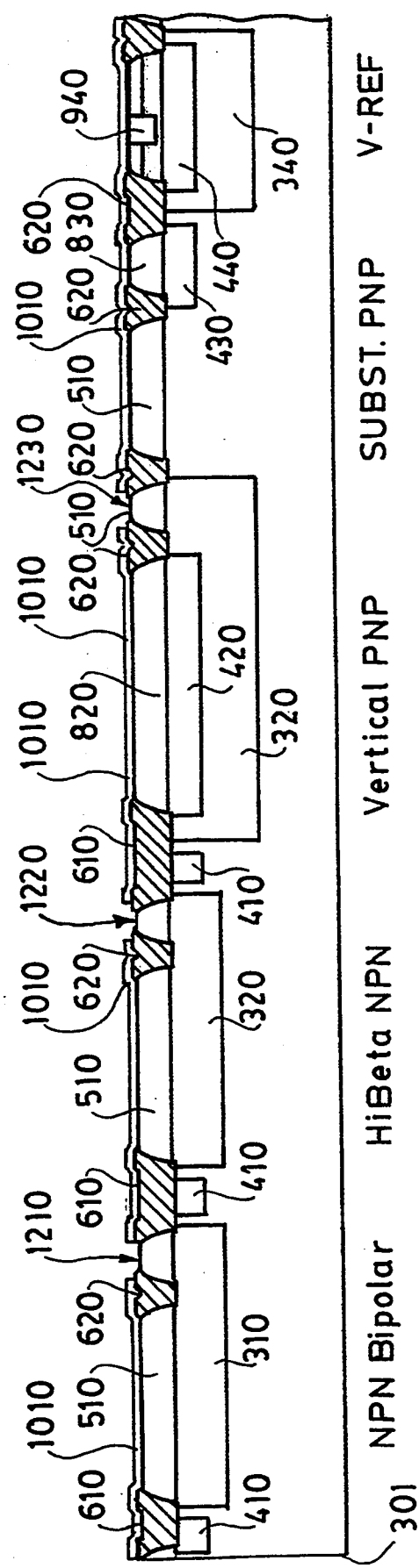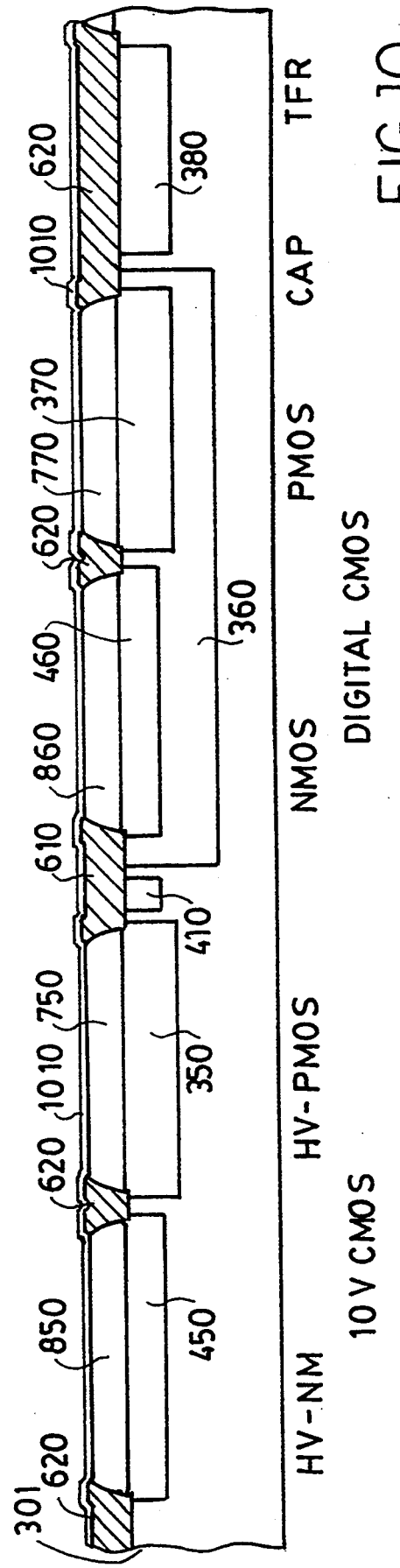
FIG.10

ELECTROSTATIC DISCHARGE PROTECTION

CROSS REFERENCE TO RELATED APPLICATIONS

This application is a continuation-in-part of U.S. patent application Ser. Nos. 07/785,400, filed Oct. 30, 1991, and 07/917,635, filed Jul. 20, 1992, which are hereby incorporated by reference. Commonly assigned U.S. patent application Ser. Nos. 07/785,325 and 07/785,395, both also filed Oct. 30, 1991, disclose related subject matter.

FIELD OF THE INVENTION

The present invention relates to electronic semiconductor devices and methods of fabrication, and, more particularly, to semiconductor devices and fabrication methods integrating both bipolar and field effect devices.

BACKGROUND AND SUMMARY OF THE INVENTION

Demands for increased performance and complexity for integrated circuits have led to circuits including both CMOS transistors for high packing density and bipolar transistors for high power and speed. Such BiCMOS circuits provide particular advantages for mixed mode (analog plus digital) applications which can combine the low noise characteristics of bipolar transistors in analog subcircuits and still use well known CMOS digital subcircuits. See for example, R. Haken et al, "BiCMOS Processes for Digital and Analog Devices," Semiconductor International 96 (June 1989).

However, analog circuits typically will operate with both positive and negative power supplies and at higher voltages than the typical positive power supply digital circuit. For example, digital CMOS circuits typically operate between 0 and +5 volts, whereas analog circuits may operate with both −5 volt and +5 volt power supplies in addition to ground. Further, analog circuits benefit from the use of both CMOS transistors and bipolar transistors; thus a mixed mode BiCMOS circuit may have CMOS transistors operating between 0 and +5 volts plus other CMOS transistors operating between −5 and +5 volts. This complicates fabrication because the digital CMOS transistors will use a thinner gate oxide than the analog CMOS transistors in order to achieve sufficient performance. But then electrostatic discharge (ESD) protection becomes difficult.

Generally, MOS IC products are prone to ESD damage if their input and output pins were left unprotected, especially during handling. It is, therefore, a common practice to place ESD protection devices between the input or output pins and the supply voltage rails. MOS diodes as the ESD protection devices are used in a typical CMOS digital IC where the output signal swings between Vdd (+5.0 V) and Gnd (0 V). Usually, the silicon substrate is tied to Gnd, which makes the substrate to be the natural return point to both the output signal and the ESD current.

In mixed mode analog-digital system applications, it is very common to have blocks of circuit operating in several different voltage supply rails. For example, a digital circuit based on positive logic level would operate between Vcc (+5 V) and Gnd (0 V), while another digital circuit based on unusual negative logic level may operate between Gnd and Vee (−5 V). And analog circuitry may operate between Vcc and Vee. It is rather common for a BICMOS IC to have analog circuits at one end that operate between the full supply rails (Vcc and Vee) and digital circuits at another end operating between full supply rails, or the positive supply rails (Vcc and Gnd) for the positive logic compatibility. In this latter case, all digital signals would return to the Gnd supply and therefore the ESD protection for the signal pins would be implemented conventionally as shown by ESD protection devices 102 and 103 in FIG. 1a.

Typically the ESD protection devices are diodes such as Vceo diodes or Vebo diodes for bipolar circuits and NMOS or PMOS diodes or Zener diodes (if available) for CMOS circuits. ESD energy dissipates through the diode by avalanche breakdown or punchthrough, thereby creating a low impedance path.

It may not be necessary in many cases to place any ESD protection devices in between the signal terminal and the Vee supply rail because it is not relevant to the operation of the circuit under consideration, especially when gate oxides are relatively thick (greater than 250 Å). Notice, however, that the return path for the ESD current is not necessarily the Gnd supply line in this case, because the silicon substrate is now tied to the Vee rail, not the Gnd line, as in MOS. Therefore, the conventional ESD protection scheme may be vulnerable to the ESD events when the discharge current path finds its way to the silicon substrate, especially for thin gate oxide devices. Thus the preferred embodiments include ESD protection device 105.

In high-performance, high-speed, mixed-mode BICMOS IC products, the digital circuits require thin gate CMOS devices and the bipolar devices need to have small outlines, both of which exacerbate the aforementioned ESD vulnerability even when the standard diode protection devices are implemented. The gate oxide of MOS devices or bipolar devices often fail when an ESD strikes the input or output or the power supplies due to the protection diodes having a too-high breakdown voltage or a too-slow response.

The actual ESD devices need to be nonlinear devices which present very high impedance to the circuit under normal circuit operation but quickly turn on into a very low impedance mode when the signal terminal reaches a certain threshold above the normal operating voltage. The ESD capture threshold of the ESD device should be set in such a way that it is higher than the normal supply rail voltages but sufficiently lower than the gate rupture voltage of the CMOS devices in the BICMOS digital circuit. Also, the substrate area occupied by the ESD devices should be small.

In BiCMOS processes the photomask count is typically high, and increasing the number of photomasks to obtain additional devices is only used as a last resort. Thus for a BiCMOS process there is a need to provide ESD protection devices fabricated from the process steps and which provide better ESD protection than the known diodes.

The present invention provides NMOS and PMOS devices with a Zener region formed in the drain to assist in NMOS and PMOS diode breakdown and thereby provide ESD protection. Such ESD protection devices are formed with the preexisting steps of a BiCMOS process.

BRIEF DESCRIPTION OF THE DRAWINGS

The present invention will be described with reference to the accompanying drawings which are schematic for clarity.

FIGS. 3–23 including

DESCRIPTION OF THE PREFERRED EMBODIMENTS

Imbedded Zener

Figure 1A:
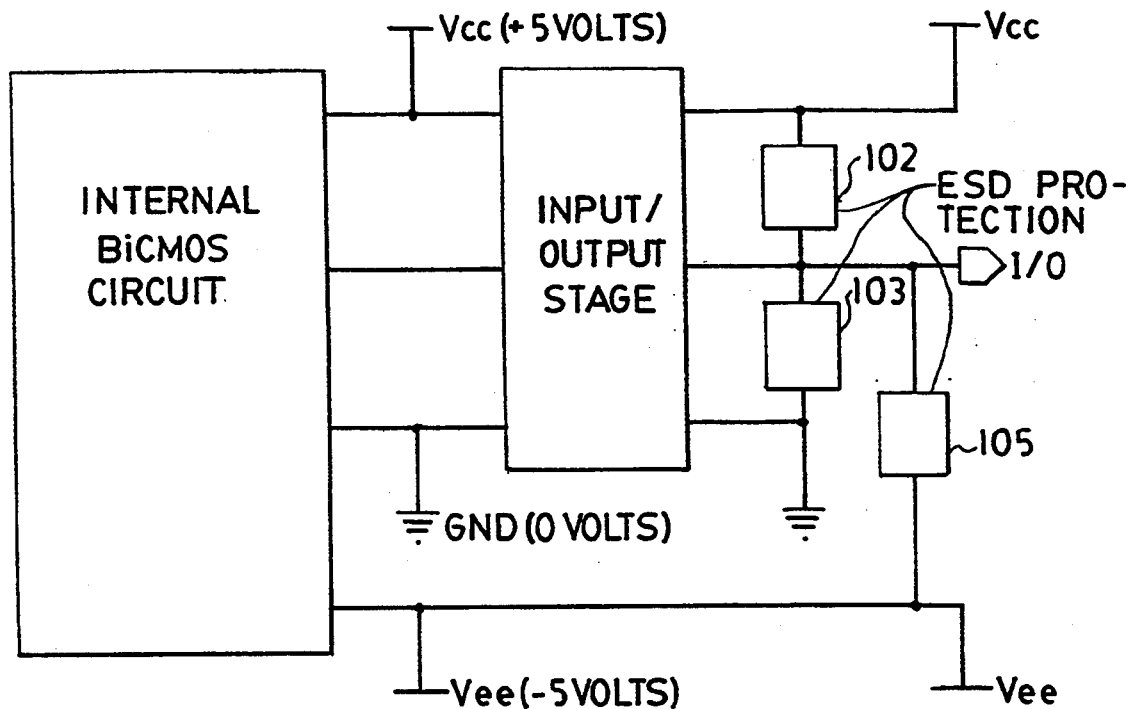
FIG. 1a–b show the arrangement of ESD protection devices in a BiCMOS integrated circuit.
Figure 1B:
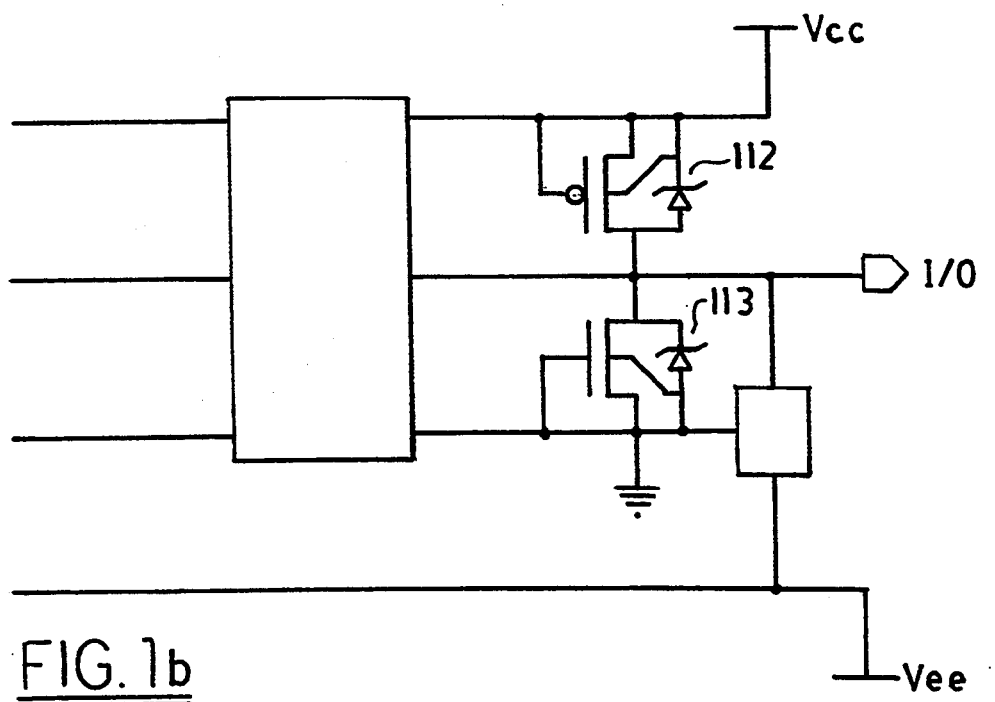
Figure 2A:
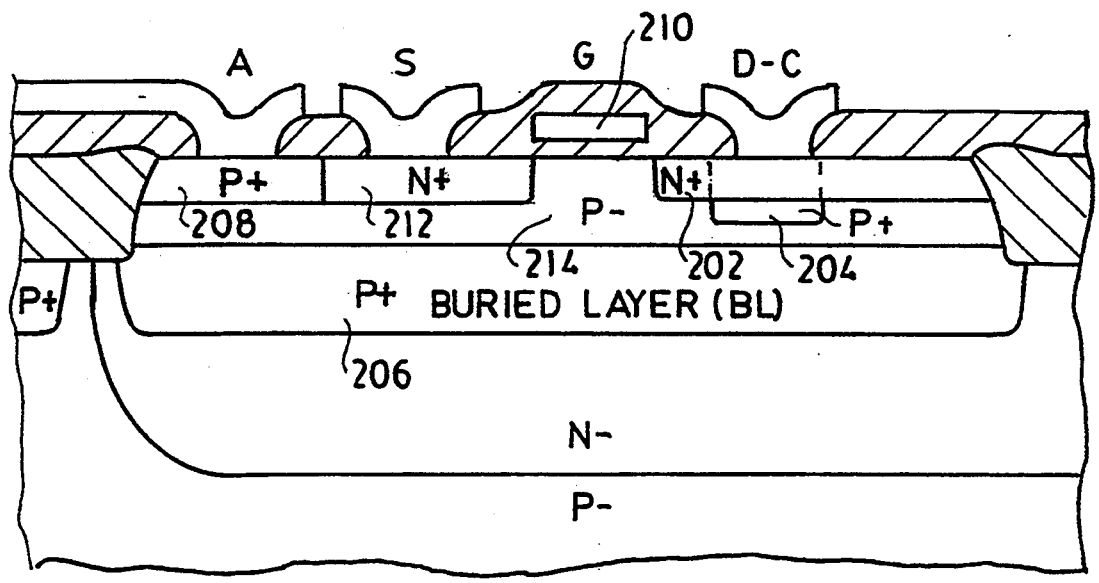
FIG. 2a–f are cross-sectional elevation views for some preferred embodiment devices and graphs of operating characteristics.
Figure 2B:
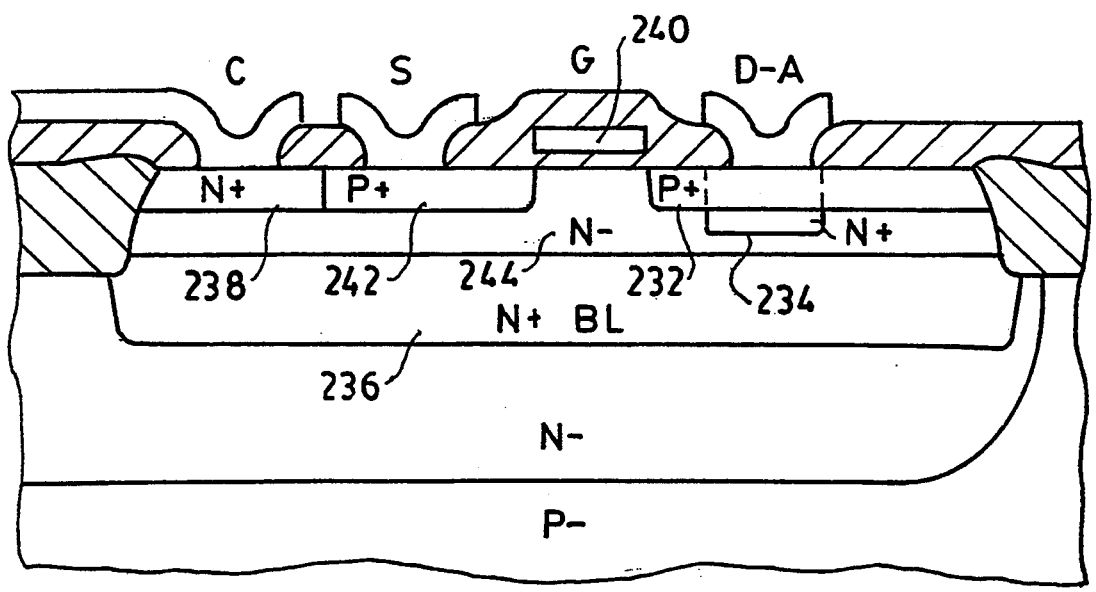

The first preferred embodiment method provides a BiCMOS process with ESD protection devices formed as Zener-assisted breakdown NMOS and PMOS diodes. FIG. 1b shows ESD protection PMOS diode 112 with imbedded Zener and ESD protection NMOS diode 113 with imbedded Zener. FIGS. 2a–b show cross sectional elevation views of protection diodes 112-113. In particular, FIG. 2a illustrates an NMOS device with N+ drain 202 also forming the cathode of a Zener diode and with P+ region 204 under the drain junction forming the Zener diode anode. Anode 204 connects to P+buried layer 206 and contact region 208. The NMOS gate, source, and drain contacts are denoted G, S, and D, and the Zener diode anode and cathode contacts are denoted A and C. FIG. 2b analogously shows a PMOS with P+ drain 232 which also forms a Zener anode, N+ Zener cathode 234, Cathode 234 connects to N+ buried layer 236 and contact region 238.

These protection diodes operate as follows. First consider the NMOS of FIG. 2a with the gate and source connected as in FIG. 1b but without the Zener anode region 204. When a positive voltage spike strikes drain 202 (or a negative spike strikes the source), the voltage of drain 202 increases relative to the voltage of gate 210 and source 212, the depletion region at the junction of drain 202 and channel region 214 expands and the electric field increases until leakage current electrons through the depletion region acquire sufficient energy to ionize atoms in the depletion region and cause avalanche breakdown. The avalanche current provides a base current and forward bias of the PN junction of channel region 214 and source 212. This turns on the parasitic NPN bipolar transistor made of source 212 (emitter), channel region 214 (base), and drain 202 (collector) and dissipates the voltage spike applied to drain 202.

Analogously, a negative voltage spike striking drain 232 (or a positive spike striking source 242) of the PMOS of FIG. 2b with gate and source connected and without Zener cathode region 234 will also create avalanche current at the junction of drain 232 and channel region 244 to turn on the parasitic PNP made of source 242 (emitter), channel region 244 (base), drain 232 (collector).

Imbedded Zener diodes 204-202 and 234-232 change the foregoing by providing a Zener breakdown current at a lower voltage than the avalanche breakdown current, and this Zener current then provides the base current for turning on the parasitic NPN and PNP bipolar transistors, respectively. Thus the protection diode breakdown is not determined by the drain and channel region doping levels, as would be the case without the imbedded Zener diodes, but rather by the drain and Zener region doping levels. And imbedding the Zener diode in the drain and using it to trigger avalanche breakdown and parasitic bipolar action provides a smaller protection structure than using a Zener alone because the series resistance of the Zener diode generates a voltage drop across the Zener which may exceed the rupture voltage of the MOS gate oxides. In fact, Zener diodes used for ESD protection generally have large areas to lower the series resistance. In contrast, the series resistance of a MOS transistor in breakdown is smaller than the series resistance of a Zener diode occupying equivalent area. Also, the smaller size implies a lower junction capacitance and thus faster response to protect against ESD.

Figure 2C:
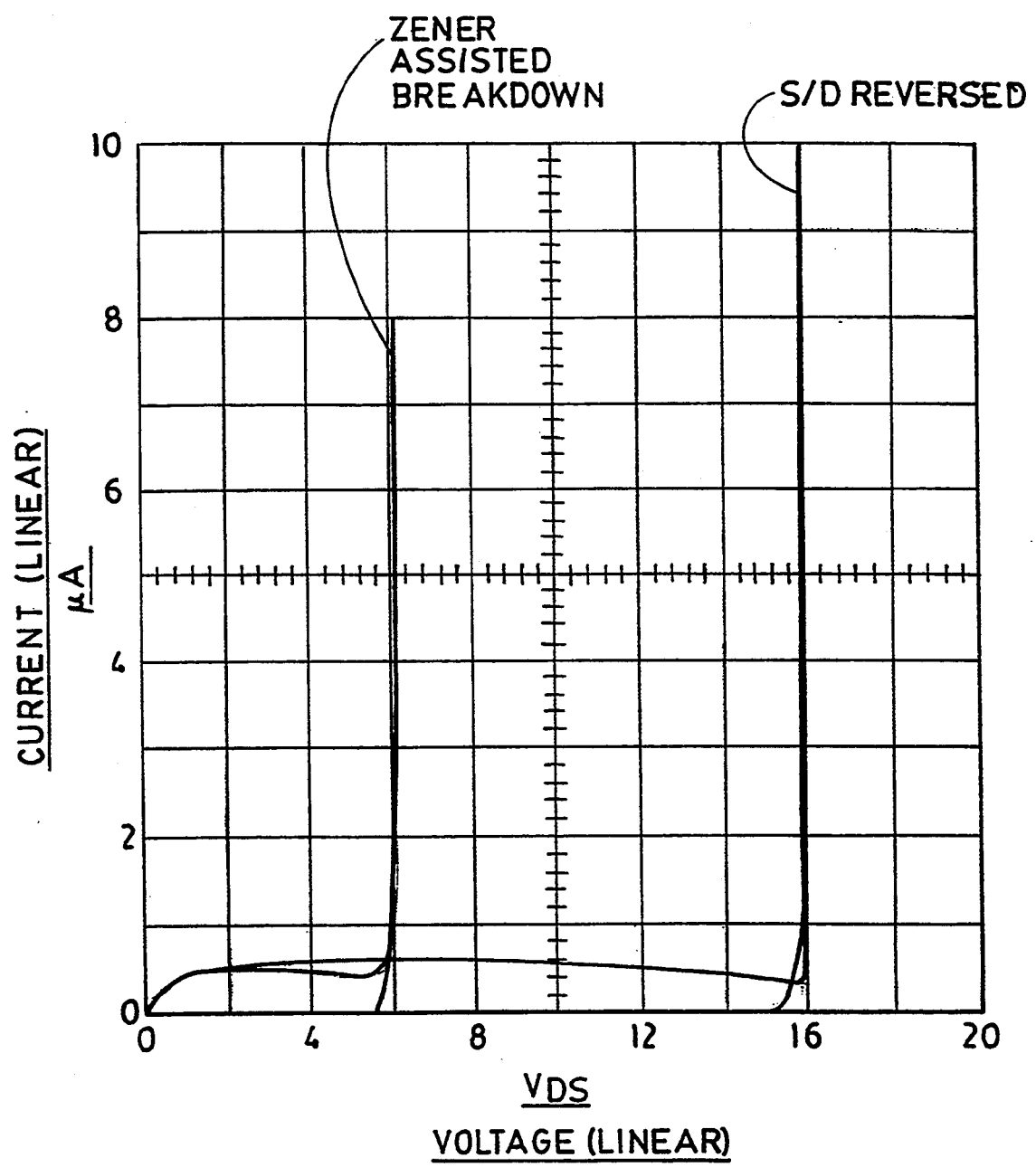

FIG. 2c shows the lowering of the breakdown voltage by use of Zener assist in an NMOS as in FIG. 2a with the gate tied to the source. The gate width is 50 µm and the gate length is 1.4 µm. In particular, the Zener assisted breakdown occurred at about 6 volts and the unassisted avalanche breakdown occurred at about 16 volts. The current scale in FIG. 2c is 1 µA per division.

Figure 2D:
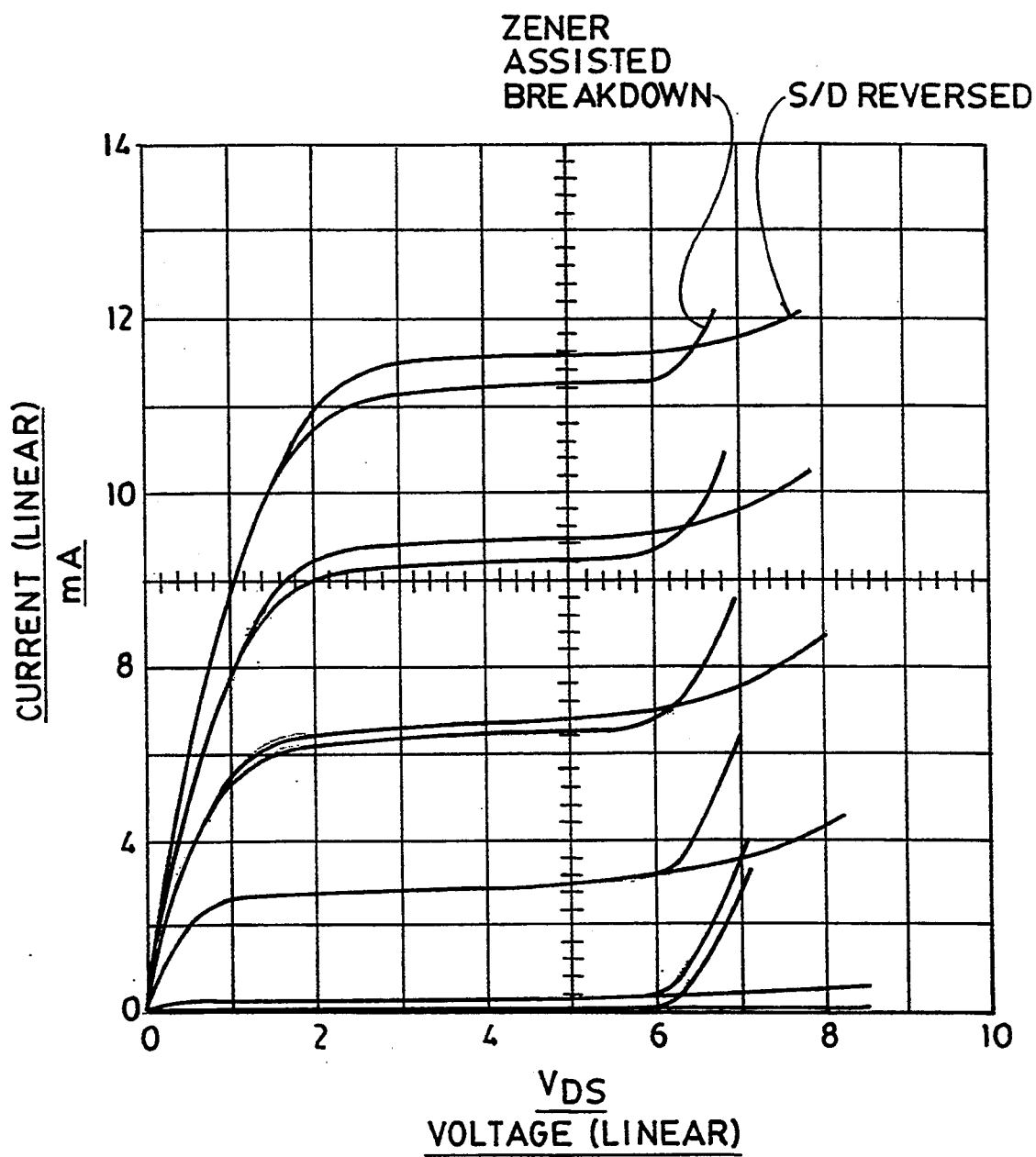

Similarly, FIG. 2d shows the drain current versus source-drain voltage curves of the NMOS with a Zener imbedded in the drain and for various gate to source voltages. Indeed, for a source-drain voltage of 6 volts the Zener assisted breakdown begins and the drain current rises rapidly for all gate to source voltages. The current scale in FIG. 2d is 2 mA per division. Without the imbedded Zener the drain current increases nonlinearly and slowly for source-drain voltages greater than 6 volts.

Figure 2E:
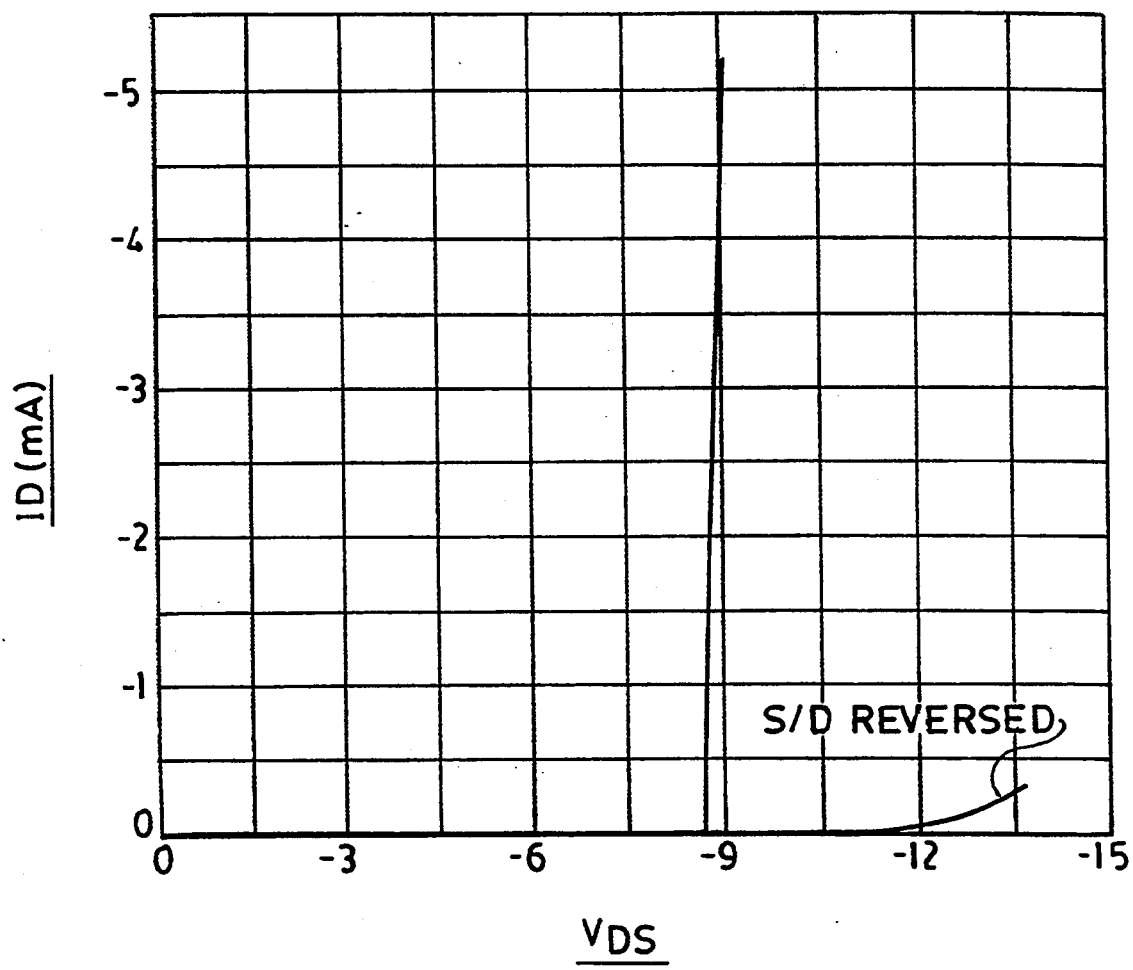
Figure 2F:
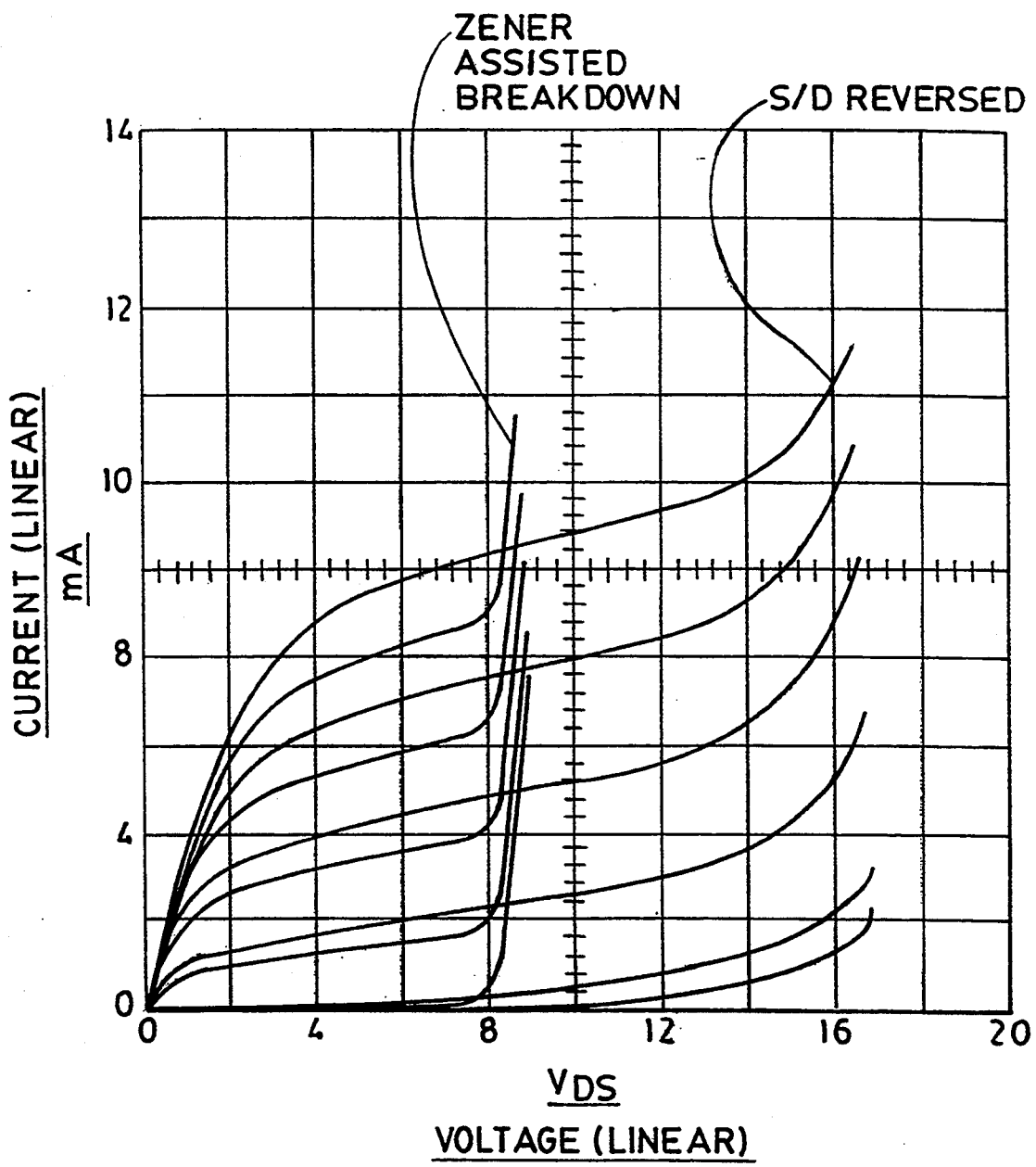

FIGS. 2e–f are the corresponding curves for a PMOS transistor with an imbedded Zener. Here the breakdown voltage is reduced from greater than 16 volts to 9 volts.

Fabrication Steps

FIGS. 3–23 are cross sectional elevation views of the steps of the preferred embodiment method of BiCMOS integrated circuit fabrication. The method provides the following devices: an NPN transistor with a beta of at least 80 and a cutoff frequency $f_T$ of at least 4 GHz and a breakdown voltage of at least 10 volts, an isolated PNP transistor with a beta of at least 60 and an $f_T$ of at least 1.5 GHz, a super beta NPN transistor with a beta of at least 300, a substrate PNP transistor, 5-volt NMOS and PMOS for digital circuitry, 6-volt breakdown NMOS and 9-volt breakdown PMOS with imbedded Zener diodes for ESD protection diodes, 10-volt NMOS and PMOS for analog circuitry, an isolated poly-to-poly capacitor using poly oxide, and a precision laser-trimmable thin-film NiCr resistor for optimizing circuit performance after fabrication. The power supplies would be at −5 volts, ground, and +5 volts with the substrate at about −5 volts. The digital CMOS operates between ground and +5 volts despite the substrate bias. The imbedded Zener diodes for the ESD protection NMOS diodes derive the Zener anode region from the P base implant of the NPN bipolar transistors, and the imbedded Zener diodes for the PMOS diodes derive the Zener cathode region from the N base implant of the PNP bipolar transistors.

The effective gate lengths are typically 0.9 μm and the emitter size about 1.4 μm square although other sizes are available with the same process steps.

The method is modular so that various groups of steps may be omitted if a circuit does not demand all of the foregoing devices; however, the method uses only 21 mask levels to fabricate all of these devices. In addition, one further mask level permits inclusion of a separate low-noise Zener diode. In this case the NMOS protection diode's Zener anode region could be derived from the P+ implant of the separate low-noise Zener. The method, including the separate low-noise Zener diode fabrication, includes the following steps:

(1) Begin with a <100> oriented monocrystalline silicon wafer of p-type with resistivity in the range of 8 to 15 ohm-era and with oxygen concentration in the range of 30 to 36 parts per million. This level of oxygen exceeds the room temperature solid solubility limit, and the heat treatments of steps (2) and (11) initiate deep defects sites and precipitate oxygen in the interior of the silicon wafer. Later processing steps will grow these initial deep defects into major dislocations and will also drive oxygen from the surface leaving a denuded surface zone. The dislocations and precipitated oxygen will getter various impurities such as iron and copper introduced in subsequent processing steps, and the denuded zone provides low defect silicon for device fabrication. These internal defects decrease the lifetimes and diffusion lengths of minority carriers deep in the substrate.

(2) Thermally grows a silicon dioxide ("oxide") layer of thickness 5300 Å on the surface of the silicon wafer. Steam oxidation (about one hour at 1050 C.) provides quicker oxidation than dry oxidation (more than 10 hours at 1100 C.). Indeed, growth in oxygen for two hours at 750 C. will stabilize microclusters of oxygen precipitates and a subsequent growth in steam for one hour at 1050 C. will generate interstitial silicon which helps dissolve oxygen near the wafer surface to form a denuded zone for device fabrication.

(3) Spin a layer of photoresist onto the oxide coated wafer, and expose and develop a pattern in the photoresist defining all needed N+ buried layers. Both types of NPN devices (regular and high beta) and both types of PMOS devices (digital and analog) plus poly-to-poly capacitors and NiCr resistor areas will all be situated over N+ buried layers.

(4) Use the patterned photoresist as a mask to wet etch the exposed underlying oxide with buffered HF.

(5) Strip the patterned photoresist with piranha (a sulfuric acid, hydrogen peroxide solution). This leaves the oxide coated silicon wafer with openings in the oxide layer at the locations of eventual buried N+ layers.

(6) Implant arsenic ions at an energy of 80 KeV and a dose of $3 \times 10^{15}$ ions/cm$^2$ using the patterned oxide as an implant mask. The projected range for arsenic ions at 80 KeV is about 400–500 Å in both silicon and oxide, so the arsenic ions do not penetrate the oxide and only enter the silicon through the openings defining the N+ buried layers.

(7) Spin another layer of photoresist onto the oxide coated wafer, and expose and develop a pattern in the photoresist defining all needed N− buried layers. Both digital NMOS and PMOS devices plus isolated PNP devices and Zener diodes will all be located over N− buried layers. This layer of photoresist will cover all of the openings in the underlying oxide through which the arsenic was implanted in step (6) except in the locations of digital PMOS devices where the opening in the oxide will again be exposed. Additionally, the oxide in the N− buried layer locations will be exposed. Note that only a single oxide is being used for both N+ and N− buried layer location definition; this avoids oxide strip and regrowth steps.

(8) Use the patterned photoresist as a mask to wet etch the exposed underlying oxide with buffered HF. Buffered HF etches oxide much faster than silicon, so the exposed silicon in the digital PMOS locations will not be significantly etched.

(9) Implant phosphorus ions at an energy of 120 KeV and a dose of $2 \times 10^{13}$ ions/cm$^2$ with the patterned photoresist as the implant mask. The projected range of phosphorus at 120 KeV in photoresist is about 2000 Å and in silicon about 1400 Å; thus the photoresist can effectively mask the phosphorus even over the locations of oxide openings from step (4). Note that the phosphorus (peak 1400 Å) is much deeper than the previously implanted arsenic (peak 500 Å) in the locations for digital PMOS devices.

(10) Strip the patterned photoresist with piranha. This leaves the oxide coat with openings from both steps (4) and (8).

(11) Anneal the oxide coated wafer in an oxidizing atmosphere to both grow 2300 Å of oxide on exposed silicon (and further increase the thickness of the existing oxide coat elsewhere) and drive in the implanted arsenic and phosphorus. The oxide grows faster on the exposed silicon, so when the oxide is removed in step (13) a faint pattern of the N+ locations will appear on silicon surface. The phosphorus diffuses faster than the arsenic, and the resulting N+ arsenic doped regions extend down about 3 micrometers (μm) from the wafer surface and the N− phosphorus doped regions extend down about 7 μm. Note that a single drive in diffusion for both the arsenic and the phosphorus saves significant overall processing time in comparison with separate drive ins of the arsenic and phosphorus. The oxide growth plus drive in may be performed as follows: first, use a nitrogen atmosphere (with a little oxygen to prevent silicon nitride formation) at 750 C. for about three hours to condense oxygen nucleation in bulk so unstable microclusters grow into more stable precipitate centers which later attract more oxygen and lead to large defects. Second, again in a nitrogen atmosphere with a little oxygen at 1200 C. for about three and two thirds hours, drive in the buried layer implants, denude the surface, and grow bulk detects. Lastly, in an oxygen atmosphere at 950 C. for one half hour, grow the majority of the oxide.

Figure 3:
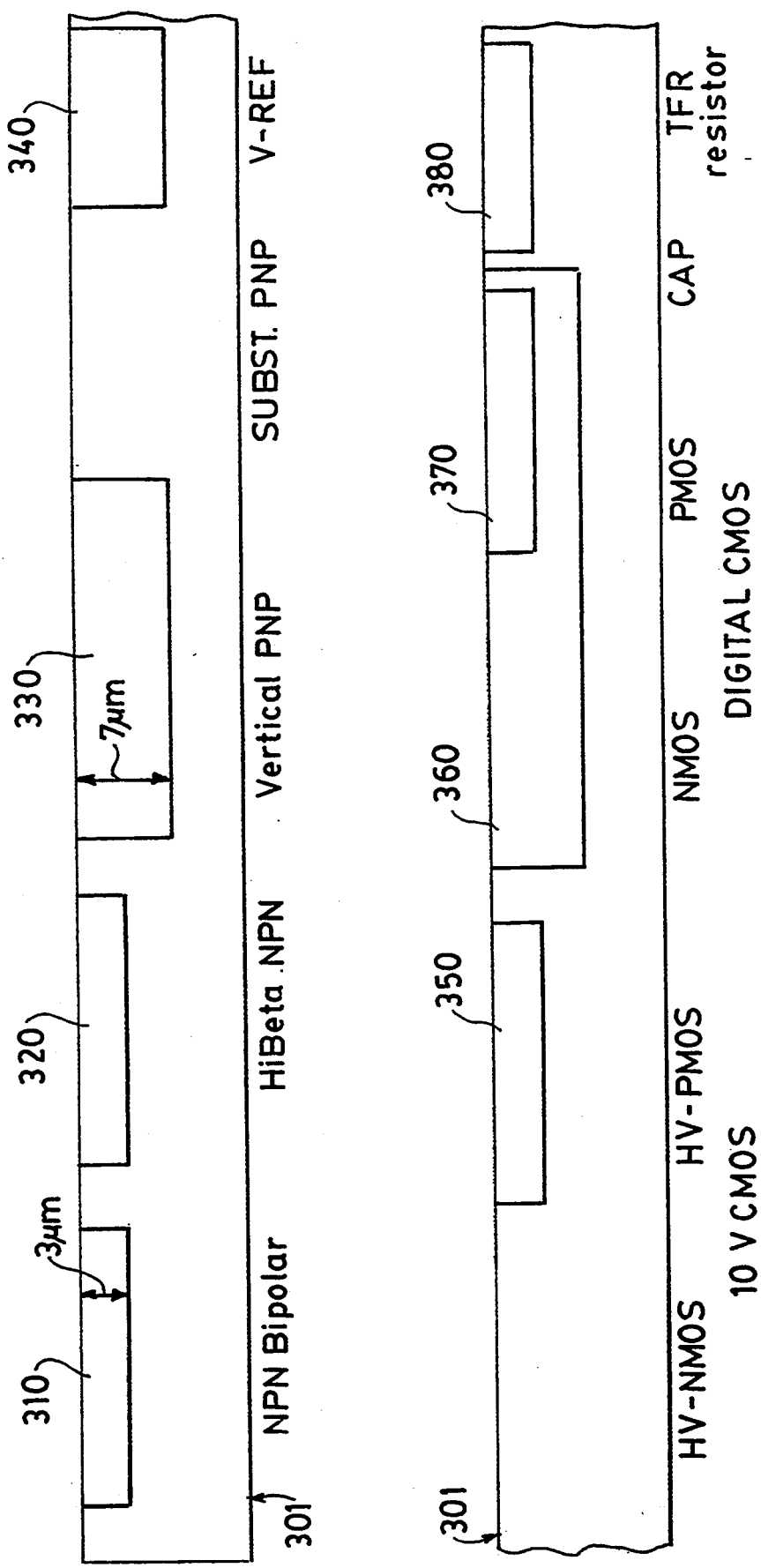

(12) Strip the oxide with buffered HF. FIG. 3 illustrates the resulting regions in wafer 301 for representative devices as follows: 310 and 320 will be N+ buried layers for NPN and high beta NPN devices, respectively, 330 will be an N− buried layer for an isolated vertical PNP, a substrate PNP does not need the buried layer, 340 will be an N− buried layer for a Zener diode, a high voltage NMOS device does not need a buried layer, 350 will be the N+ buried layer for a high voltage PMOS device, 360 is a buried N− layer for the digital NMOS and PMOS with 370 the N+ buried layer for the digital PMOS, and 380 will be an N+ buried layer for a poly-to-poly capacitor and for a NiCr resistor. The buried N− layer 360 will form a pseudo-substrate for the digital CMOS: wafer 301 will be biased at −5 volts and the analog devices (bipolar and high voltage CMOS) will operate between power rails at +5 volts and −5 volts, whereas the digital CMOS will operate between the usual 0 and +5 volts. Thus the digital CMOS needs isolation from the portion of wafer 301 at −5 volts. Buffed layer 360 biased at +5 volts (usual CMOS bias for N substrate) provides this isolation by forming a reversed biased junction with the remainder of wafer 301. Hence, switching noise electrons generated by the digital CMOS will be contained in N− layer 360 and away from the analog devices by the 10-volt barrier at the junction with the P-wafer at −5 volts.

(13) Spin a 1.5 μm thick layer of photoresist onto bare wafer 301, and expose and develop a pattern in the photoresist defining all needed P+ buried layers and also P+channel stops. The buried P+ locations may be aligned to the pattern of the N+ buried layer locations. Both isolated and substrate PNP devices, Zener diodes, and both high voltage and digital NMOS devices will all be located over P+ buried layers.

Figure 4:
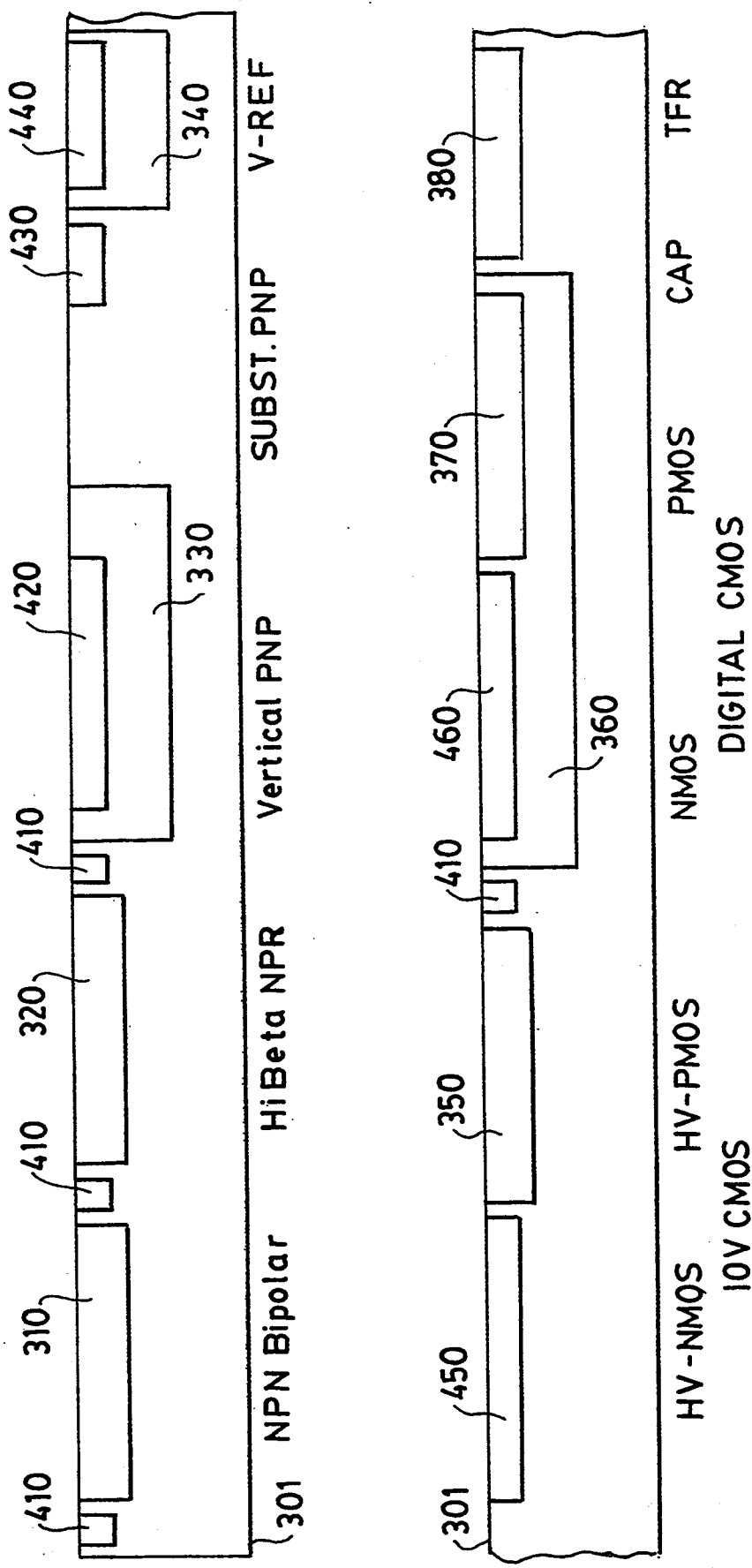

(14) Implant boron ions at an energy of 120 KeV and dose of $1\times10^{14}$ ions/cm$^2$ using the patterned photoresist as the implant mask. The boron has a projected range of about 3500 Å in silicon and 5000 Å in photoresist. Strip the photoresist with piranha; FIG. 4 shows the resulting cross section with representative device locations. In particular, P+ buried channel stop regions 410 will eventually be under recessed isolation oxide regions, P+ buried layer 420 will be the subcollector for the isolated vertical PNP device, P+ buried layer 430 will be part of the surface collector contact for the substrate PNP device, P+ buried layer 440 will be part of the anode structure of the Zener diode, and P+ buried layers 450 and 460 will underlie the high voltage analog and digital NMOS devices, respectively. Note that P+ buried layers 420, 440, and 460 lie completely within N− buried layers 330, 340, and 360, respectively, which act as pseudo N− substrates. Later oxide isolation makes this structure essentially become an N− substrate on P-wafer 301 and yields isolated circuits and true complementary devices from a triple buried layer structure. The implanted boron will be driven in to a depth of about 2.5 μm during the epitaxial deposition of step (15), so there is no separate drive in anneal.

Figure 5:
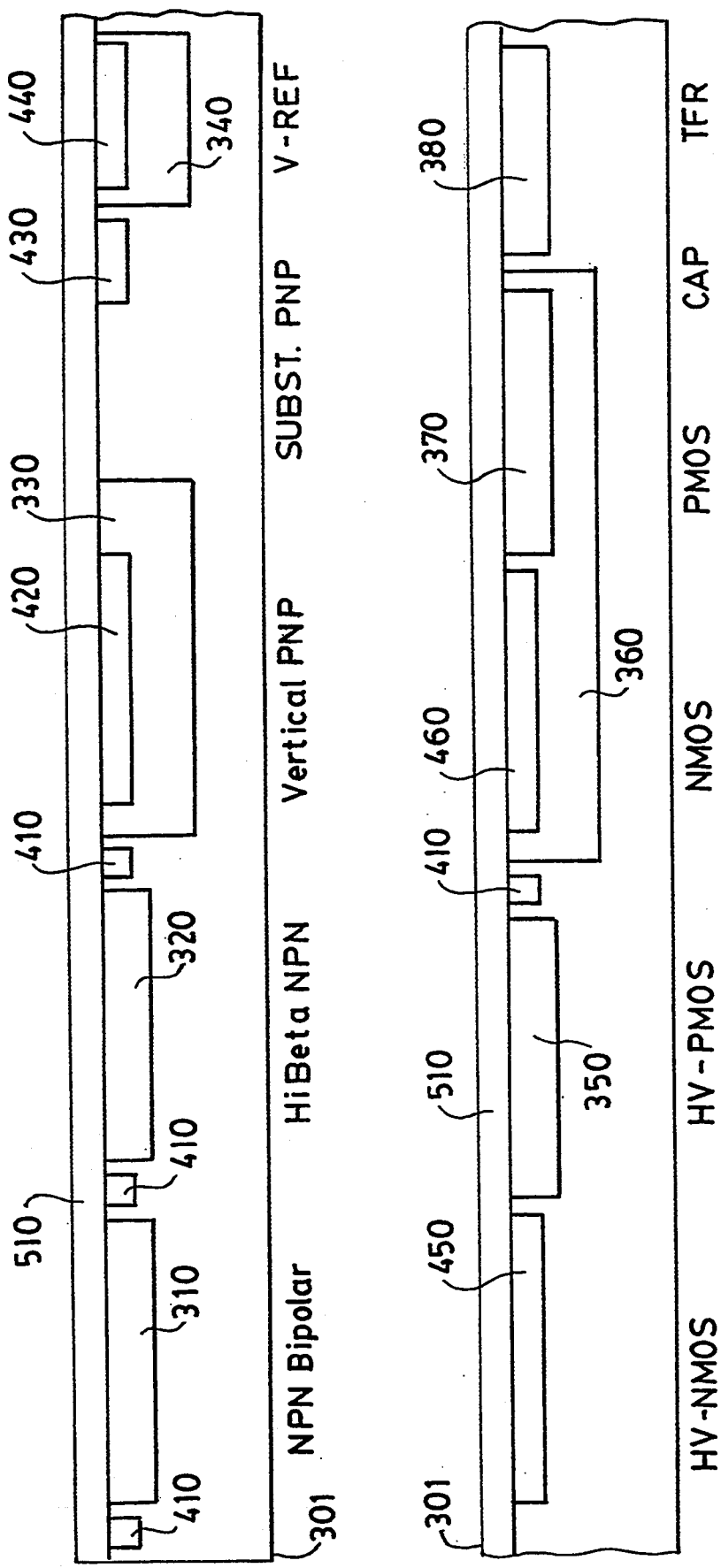

(15) Etchback about 2000 Å of implanted wafer 301 in HCl at 1175 C. (2 minutes) in preparation for epitaxial deposition; this etchback must be limited to avoid removing a significant amount of the implanted boron. Epitaxially deposit in situ arsenic-doped silicon layer 510 of thickness 1.7 μm onto implanted wafer 301 by thermal decomposition (~1060 C.) of dichlorsilane plus arsine. The arsenic doping level is set to yield a resistivity of 0.8 ohm-era (roughly $8\times10^{15}$ atoms/cm$^3$) for layer 510. This combination of thickness and resistivity provides the correct performance of the NPN devices in terms of breakdown and Early voltages plus also permits counter doping to provide P wells in the epilayer 510. The P wells need to be generated with a very low thermal budget, so epilayer 510 must be thin. The epitaxial deposition temperature also drives in the boron implanted in step (14). FIG. 5 illustrates the epilayer 510 on wafer 301. Further, the avoidance of drive ins (low thermal budget) and a shallow emitter permit such a thin epilayer due to the lessening of dopants diffusing up from the buried layers (subcollectors) to narrow the active collectors. Indeed, the epilayer thickness and doping relate to Early voltage and emitter-collector breakdown so that the following can be achieved for the NPN devices:

| Operating Voltage | Epi Deposition Thickness | Epi Doping/cm$^3$ | $BV_{ceo}$ | Early Voltage | β |
|---|---|---|---|---|---|
| 10 V | 1.5–1.8 μm | $5\times10^{15}$–$1\times10^{16}$ | 11–13 V | 35–55 V | 90–150 |
| 20 V | 2.2–2.8 μm | $2\times10^{15}$–$5\times10^{15}$ | 20–24 V | 40–65 V | 90–150 |

The specific details below are for the 10-volt process. Note that the product of beta times early-voltage is at least 5000, and about 6000 is typically achieved.

(16) Thermally grow a pad oxide of thickness 625 Å on epilayer 510 in steam at approximately 900 C.; this consumes about 300 Å of epilayer 510. This pad oxide will provide stress relief for the silicon nitride ("nitride") oxidation mask during the subsequent recessed local oxidation of the silicon (LOCOS) to create recessed isolation oxide regions.

(17) Deposit by LPCVD a 1200 Å thick layer of nitride on the pad oxide.

(18) Spin a 1.5 μm thick layer of photoresist onto the nitride/oxide coated wafer 301, and expose and develop a pattern in the photoresist defining all recessed isolation oxide locations.

(19) Plasma etch the nitride, pad oxide, plus underlying silicon using the patterned photoresist as the etch mask. The nitride and pad oxide are relatively thin, so an isotropic etch would suffice for the initial stages of the plasma etch, and a mixture of $SF_6$ and $O_2$ gives a relatively anisotropic etch of the silicon. Etch about half way through epilayer 510, that is, to a depth of about 0.65–0.7 μm.

(20) Strip the photoresist with piranha. This leaves trenches in wafer 301 with the patterned nitride and pad oxide coating the tops of the mesas between the trenches.

(21) Oxidize the exposed silicon trenches in an oxygen atmosphere at 975 C. and a pressure of 25 atmospheres for 25 minutes to grow oxide to a thickness of 1.5–1.7 μm. The nitride protects the mesa tops from oxidation, but oxide grows laterally under the edges of the nitride to form "bird's head" bulges which will be eliminated in step (22). In the trenches the oxidation consumes the remaining vertical portion of epilayer 510 and reaches to buried P+ channel stop regions 410 or the P+ buried layers 420, 430, 440, 450, and 460 and the N+ buried layers 310, 320, 350, 370, and 380. Note that the relatively thin epilayer 510 permits the oxidation to consume the epilayer in the trenches without creating excessive bird's head or overrunning a low thermal budget. Also, the thin epilayer 510 permits narrow recessed isolation oxide regions for close packing of devices, especially among the NPN devices which need isolated collectors. The isolation oxide extends above the silicon surface and this permits later planarization to avoid touching the mesa silicon. This also permits pad oxide overetch in step (31) to remove the "bird's beak" without recessing the isolation oxide top; consequently, the gate width of MOS devices increases. Note that the deposited epilayer thickness was about 1.7 $\mu$m but up diffusion of the buried layers decreases this to about 1.3 $\mu$m if the edge of the buried layer is taken to be where the dopant concentration exceeds the original epilayer concentration by a factor of 10; that is, about $1 \times 10^{17}$. The isolation oxide grows down to overlap the buried layers and thereby perform its isolation function.

(22) Spin on planarizing photoresist to a thickness of 1.5 $\mu$m; the photoresist covers the irregular surface created by the oxidation of step (21) but has an essentially planar top surface. Etch back the photoresist plus the birds head oxide bulges with a plasma etch of $CHF_3$ and $O_2$. This removes all of the photoresist and approximately planarizes the surface.

Figure 6:
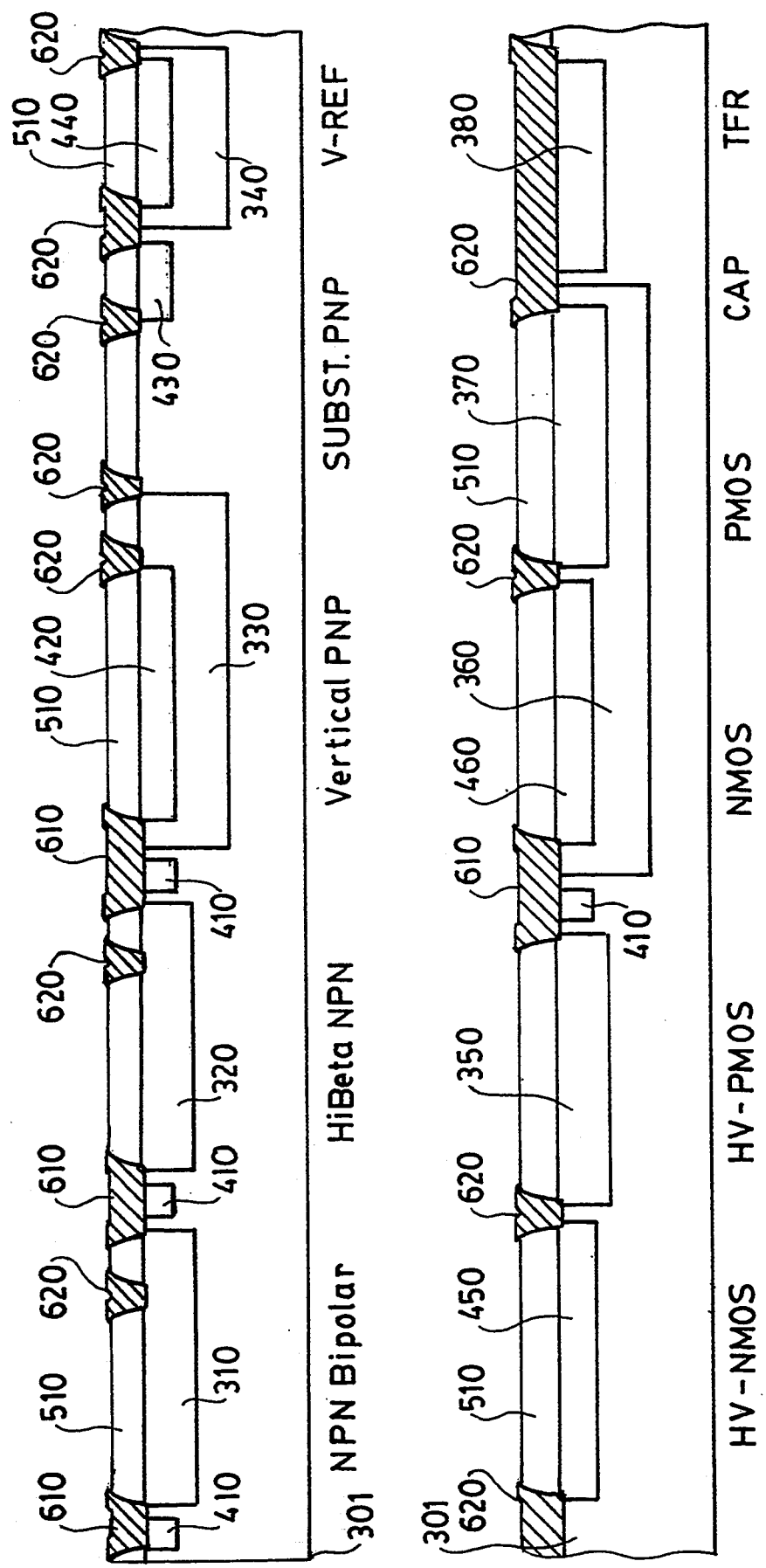

(23) Strip the nitride with hot $H_3PO_4$. FIG. 6 shows the resulting structures in wafer 301 with the recessed isolation oxide regions 610 and 620; the pad oxide is too thin to show on the drawings but remains as a deterrent to channeling in the implants of steps (25), (26), (29), (30), and (33). The 610 isolation regions have underlying P+ channel stop buried regions and separate two N type buried layers.

(24) Spin a 1.5 $\mu$m thick layer of photoresist onto wafer 301, and expose and develop a pattern in the photoresist defining the N wells needed for both analog and digital PMOS devices. (N-well is primarily just epilayer 510; this step is for surface doping to form the buried channel of proper $V_{tp}$.)

(25) Implant threshold adjusting boron ions at 30 KeV and a dose of $2.3 \times 10^{12}$ ions/cm$^2$ using the patterned photoresist from step (24) as the implant mask. This boron dose will set the PMOS device threshold voltages to about $-1.0$ volt. Note that the projected range for 30 KeV boron ions is about 1000 Å in silicon.

(26) Implant N well phosphorus ions at 160 KeV and a dose of $1.5 \times 10^{12}$ ions/cm$^2$ using the same patterned photoresist as the boron implant of step (25). The projected range of 160 KeV phosphorus is about 2200 Å; thus the phosphorus implant lies beneath the boron threshold adjustment implant but the phosphorus implant remains close to the surface. Recall that epilayer 510 had a deposited thickness of about 1.7 $\mu$m thick and an arsenic concentration of about $8 \times 10^{15}$ atoms/cm$^3$, but over the N+ buried layers the epilayer 510 deposition itself and other heat treatments caused updiffusion so the effective epilayer thickness is about 1.2 $\mu$m. After the boron and phosphorus implants, the net donor concentration at a depth of about 2000 Å is $1.5 \times 10^{16}$ atoms/cm$^3$ and at a depth of about 1000 Å the boron has convened the doping to a net acceptor concentration of about at most $1 \times 10^{16}$ atoms/cm$^3$. The PN junction formed at a depth of about 1500 Å has a depletion region extending to the wafer surface, and the PMOS devices will be buried channel type devices. The high voltage PMOS will almost be a surface channel device due to the two gate oxidations, and $V_{tp}$ is fairly high. Indeed, the N wells have an overall retrograde doping (increasing donor concentration with depth) down to the N+ buried layer peak despite the bump from this phosphorus implant. In general, retrograde doping reduces latchup and snapback parasitics by providing high conductivity wells in spite of the low surface doping required for proper MOS thresholds. The buried N+layers below the N wells further reduces latchup and snapback by providing very high conductivity regions. The well anneal of step (35) will spread out the implants, but the digital PMOS devices will remain buried channel devices and the high voltage analog PMOS devices will be almost surface channel devices.

Figure 7:
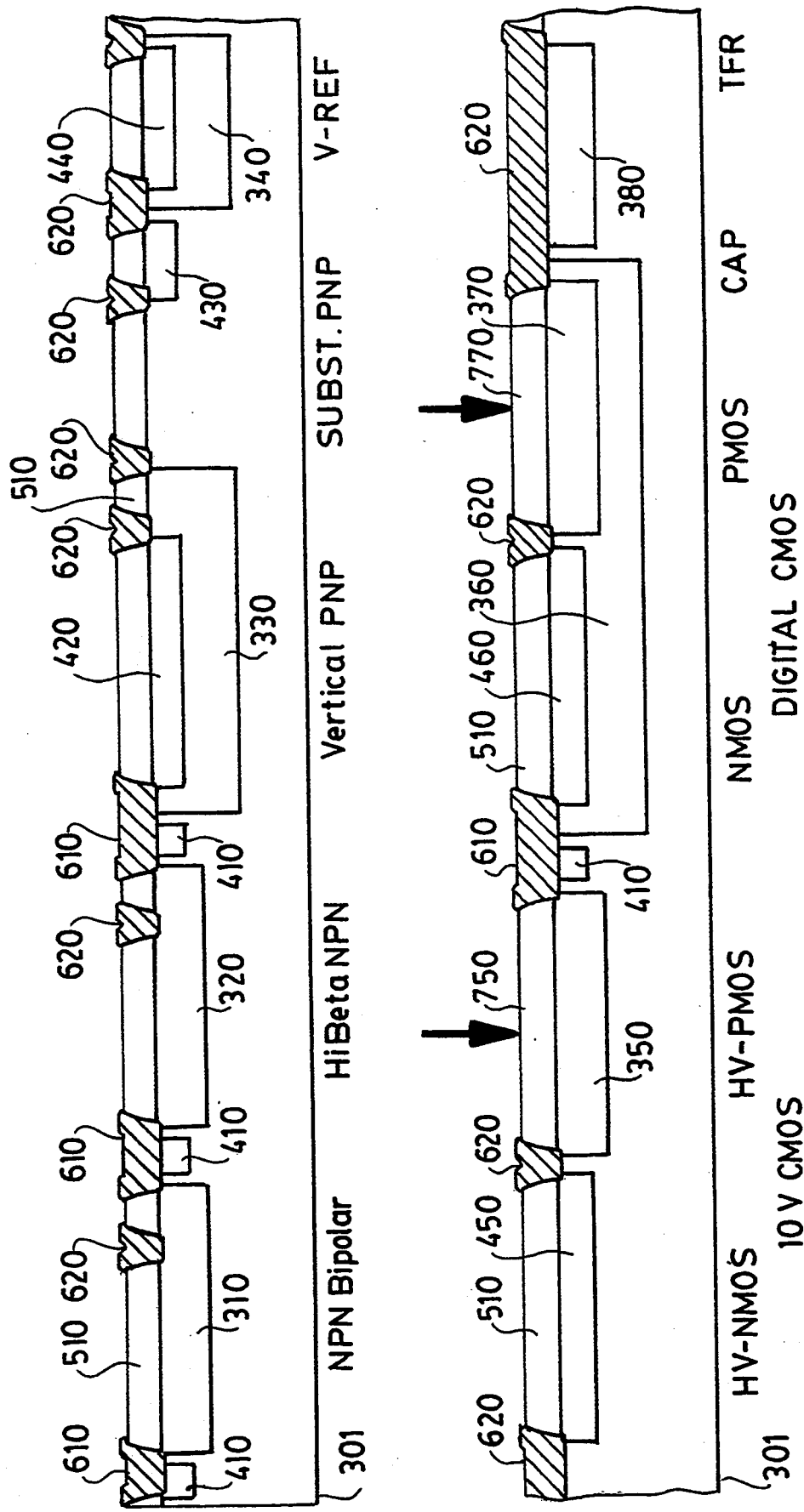

(27) Strip the patterned photoresist with piranha. FIG. 7 shows the resulting structure with N wells 750 for analog PMOS devices and N wells 770 for digital PMOS devices.

(28) Spin a 1.5 $\mu$m thick layer of photoresist onto wafer 301, and expose and develop a pattern in the photoresist defining the P wells needed for both analog and digital NMOS devices, the Zener diodes, and also the collector for the isolated PNP and a portion of the collector contact structure for the substrate PNP.

(29) Implant threshold adjusting boron ions at 50 KeV and a dose of $2.8 \times 10^{12}$ ions/cm$^2$ using the patterned photoresist from step (28) as the implant mask. This boron dose will set the NMOS device threshold voltages to about $+0.65$ volt. As noted in steps (25)–(26) the projected range for 30 KeV boron ions is about 1000 Å in silicon and the dose suffices to convert the upper 1000 Å of epilayer 510 to P type.

(30) Implant P-well, P double-charged boron ions at 125 KV and a dose of $2.7 \times 10^{12}$ ions/cm$^2$ using the same patterned photoresist as the boron threshold adjustment implant of step (29). The projected range of 250 KeV double-charged boron is about 6500 Å; this dose suffices to convert epilayer 510 to P type despite the original arsenic concentration of about $8 \times 10^{15}$ atoms/cm$^3$. During the well anneal of step (35) boron from P+ buried layers 420, 430, 440, 450, 460 will diffuse slightly upwards and meet the spreading implanted boron to change all of epilayer 5 10 to P type with the net donor concentration averaging about $4 \times 10^{16}$ atoms/cm$^3$ and peaking at the original implant depth of about 6500 Å. The P wells including P+ buried layers have an effectively retrograde doping, but less drain capacitance than implanted-only retrograde well. The buried P+ layers below the P wells further reduces latchup and snapback by providing high conductivity regions. Also, the vertical PNP devices will use this P well as its collector, so the higher doping levels will lessen the resistivity between the P+subcollector 420 and the collector contact 1826 to be formed later.

Figure 8:
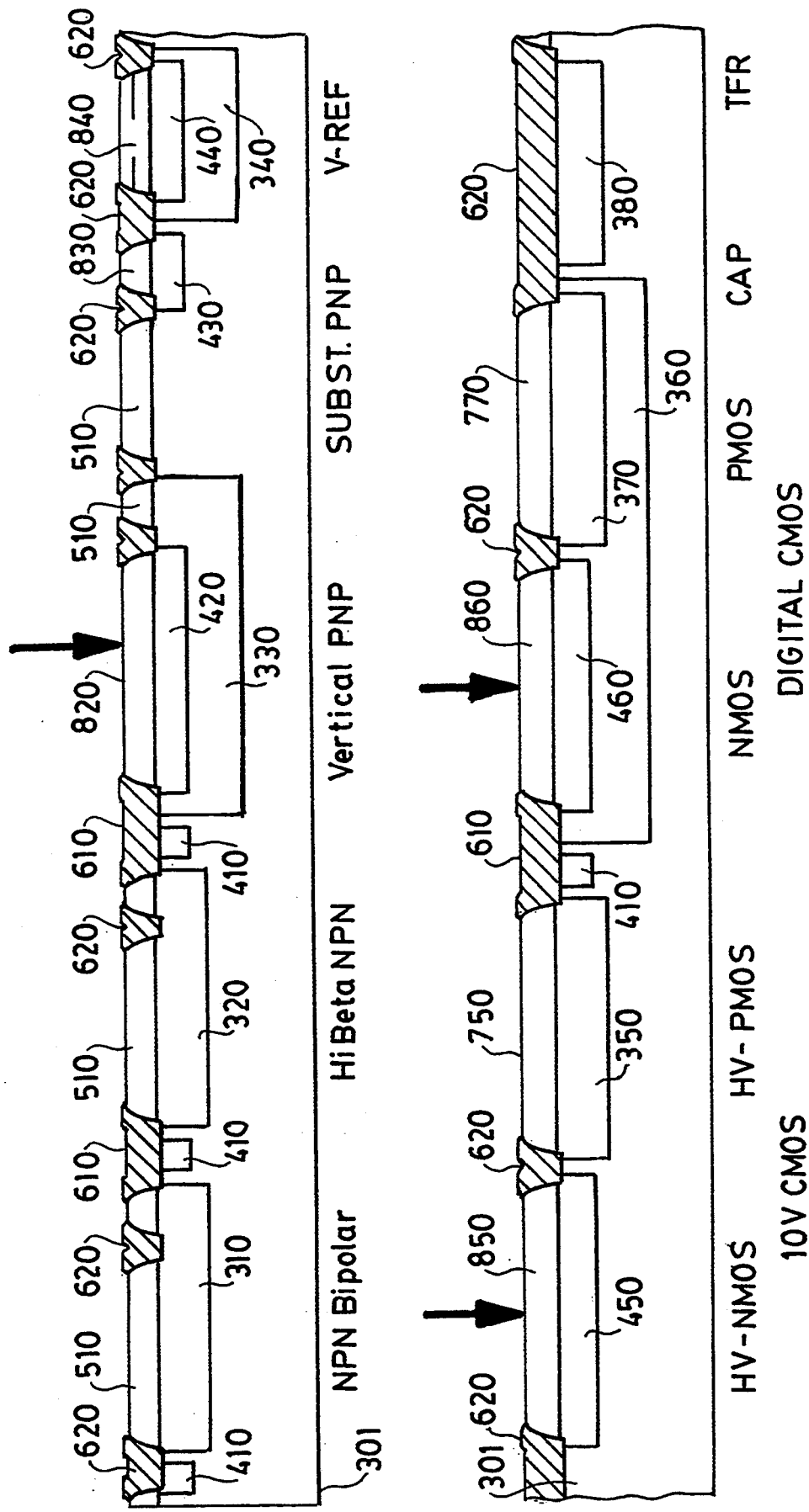

(31) Strip the patterned photoresist with piranha. FIG. 8 illustrates the P collector 820 of the isolated PNP, the collector contact portion 830 of substrate PNP, P well 840 for the Zener diodes, and P wells 850 and 860 of analog and digital NMOS devices, respectively.

(32) Spin a 1.5 μm thick layer of photoresist onto wafer 301, and expose and develop a pattern in the photoresist defining the Zener diode location.

(33) Implant boron ions at 160 KeV and a dose of $1.2 \times 10^{14}$ ions/cm² using the patterned photoresist from step (32) as the implant mask. The projected range of 160 KeV boron is about 4500 Å. The boron dose suffices to convert the central portion of epilayer 510 to P type with a doping concentration of roughly $1 \times 10^{18}$ atoms/cm³.

Figure 9:
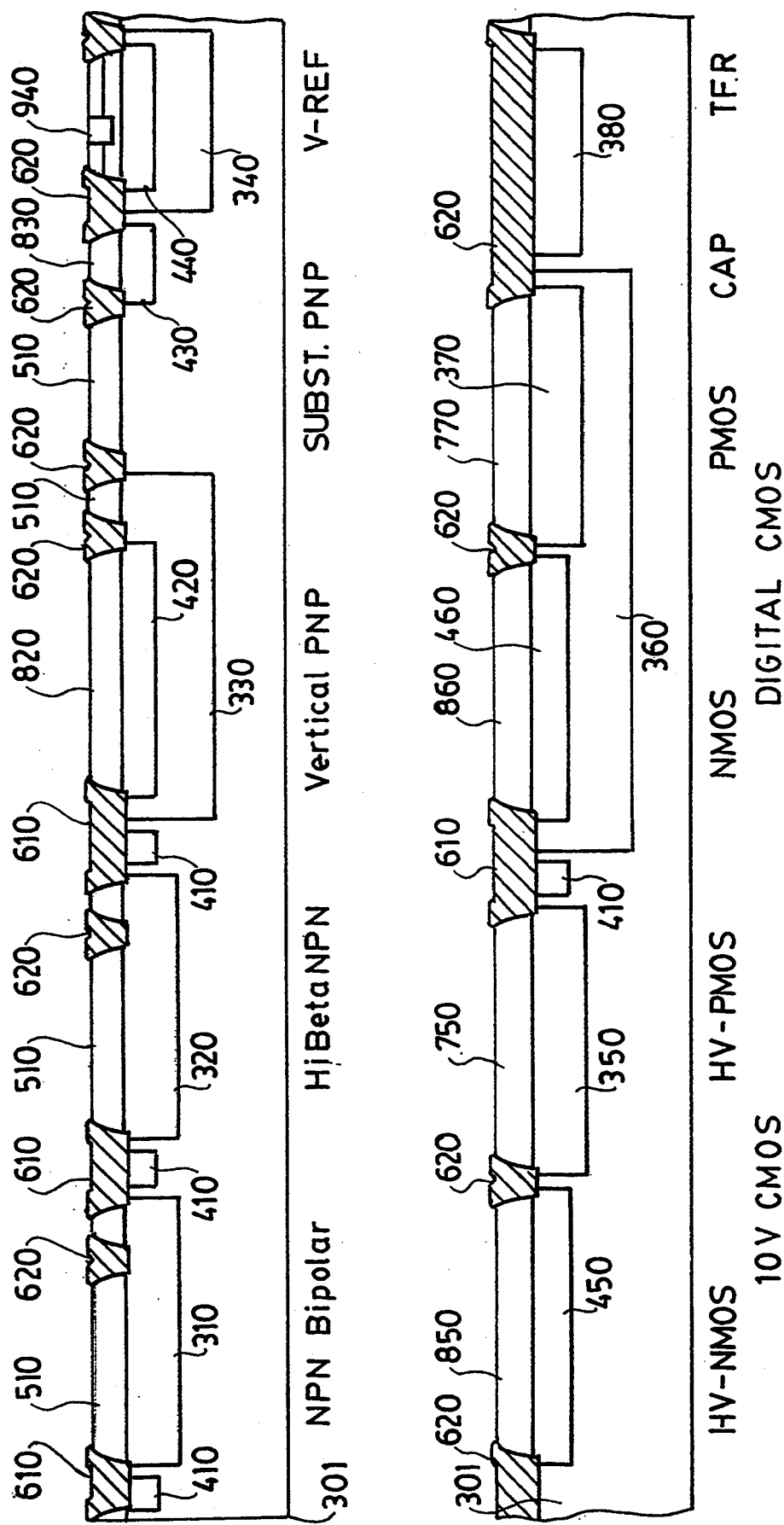

(34) Strip the patterned photoresist with piranha; FIG. 9 shows the resulting converted portion 940 of epilayer 510 for the Zener diode.

(35) Anneal wafer 301 in a nitrogen atmosphere for 30 minutes at 975 C. This activates the implanted dopants and causes some diffusion, especially of the boron.

(36) Strip the pad oxide with an HF etch plus overetch to remove most of the bird's beak from the oxidation of step (21). This effectively increases the width of the silicon mesas between the isolation oxides. After a cleanup, thermally grow 185 Å thick gate oxide on the exposed silicon of wafer 301 in a dry oxygen atmosphere at 920 C.; of course, the isolation oxides 610 and 620 also increase slightly in thickness.

(37) Deposit 5500 Å thick undoped polysilicon on the oxidized wafer 301 with LPCVD by silane decomposition.

(38) Spin a 1.5 μm thick layer of photoresist onto the polysilicon covered wafer and expose and develop a pattern in the photoresist defining the deep N+ contacts to N+ buried layers 310 and 320 and N− buried layer 330. Recessed isolation oxide surrounds these deep N+ contact locations, so the contacts will self-align with large photoresist openings.

(39) Plasma etch openings in the layer of undoped polysilicon with $SF_6$ and $O_2$ using the patterned photoresist as an etch mask. This etch selective etches polysilicon and effectively stops on the 185 Å oxide; see FIG. 10 showing polysilicon 1010.

(40) Strip the patterned photoresist with piranha.

(41) Wet etch (HF) the 185 Å oxide exposed by the openings in undoper polysilicon layer 1010 formed in step (39). That is, apertured polysilicon 1010 forms the etch mask, so the exposed portions of recessed isolation oxide will also be etched, but only a few hundred Å will be lost. FIG. 10 shows the openings 1210, 1220, and 1230 through both polysilicon layer 1010 and the 185 Å oxide.

(42) Dope apertured polysilicon 1010 and the silicon exposed through openings 1210, 1220, and 1230 with phosphorus by decomposing $POCl_3$ on the surface at 890 C. The resulting resistivity of the doped polysilicon is about 11 ohms/square, and the upper portion of the exposed silicon dopes to N+. The deep N+ contact regions have a carrier concentration of greater than $1 \times 10^{20}$/cm³. This doping of both the polysilicon layer and the deep N+ contact regions with the same step eliminates a separate diffusion or implant.

(43) Spin a 1.5 μm thick layer of photoresist onto apertured-polysilicon coated wafer 301, and expose and develop a pattern in the photoresist defining the digital NMOS and PMOS device gates and interconnection lines plus the bottom plates of the poly-to-poly capacitors plus covering the exposed silicon in openings 1210, 1220, and 1230. Because openings 1210, 1220, and 1230 were larger than the portions of wafer 301 doped, the photoresist can be smaller than the openings and thereby not cover any of the adjacent polysilicon. The gates may have nominal lengths of 1.4 μm as drawn but effective lengths of 0.9 μm.

(44) Plasma etch the polysilicon with $SF_6$ and $O_2$ or HBr and $Cl_2$ using the patterned photoresist as an etch mask. This etch selective etches polysilicon and effectively stops on oxide, so an overetch to guarantee removal of polysilicon will also not etch significantly down into wafer 301.

(45) Strip the patterned photoresist with piranha, and strip the exposed gate oxide with HF leaving just gate oxide 1110 under the gates 1160 and 1170 and the lower capacitor plate 1180 formed from polysilicon 1010 in step (44).

Figure 11:
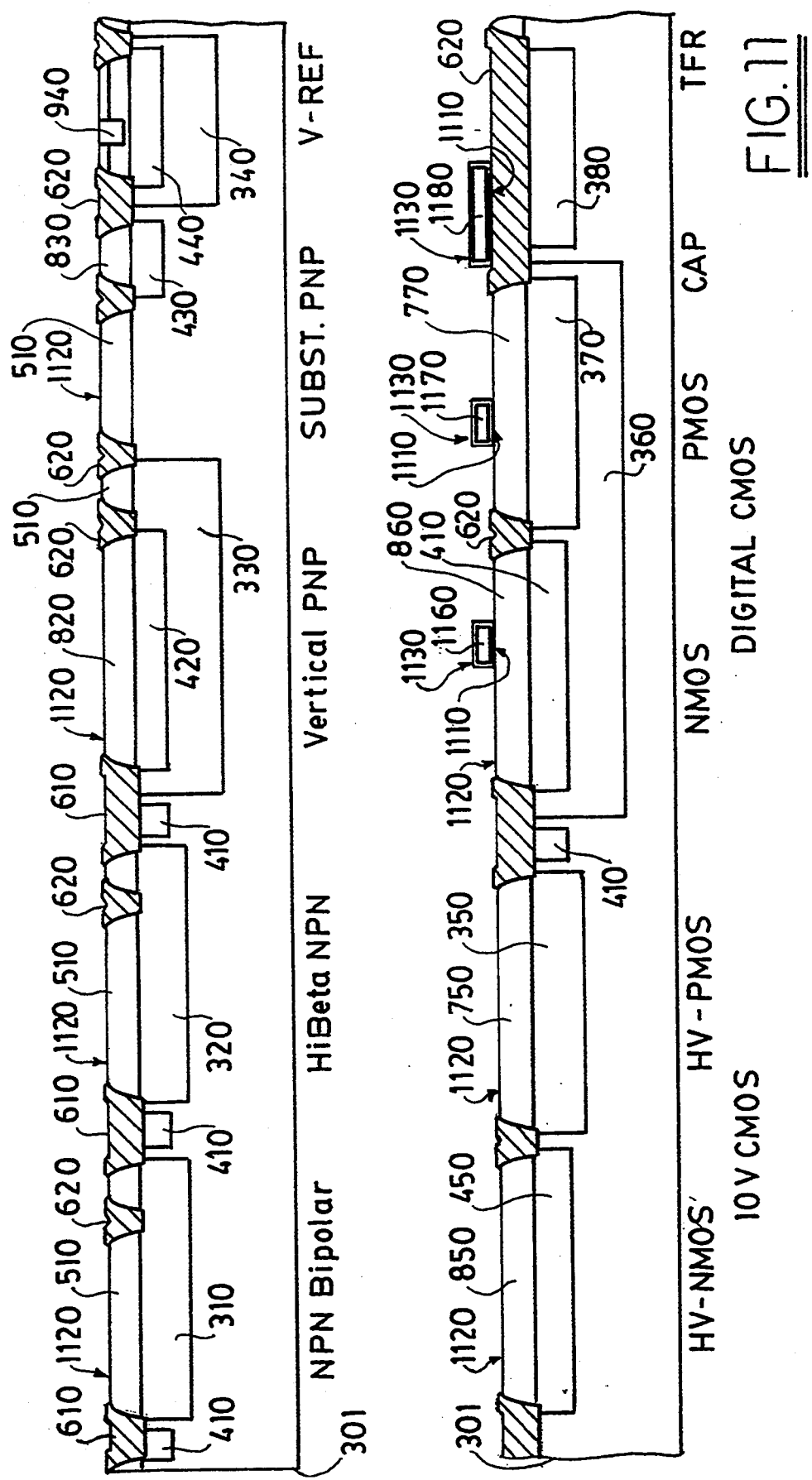

(46) Thermally oxidize patterned-polysilicon-coated wafer 301 in an oxygen atmosphere at 920 C. to grow a second gate oxide of thickness 300 Å on the exposed silicon. Note that the exposed surfaces of the patterned doped polysilicon from step (44) oxidize much more rapidly than the silicon of wafer 301 due to the heavy doping of the polysilicon, and an oxide of thickness 900 Å forms on the polysilicon. FIG. 11 illustrates the resulting structure on wafer 301 including 185 Å first gate oxide 1110 under digital NMOS and PMOS gates 1160 and 1170, respectively, 300 Å second gate oxide 1120 on the wafer surface, and 900 Å oxide 1130 on the surface of polysilicon gates 1160 and 1170 and polysilicon lower plate 1180 of the poly-to-poly capacitor.

Figure 12:
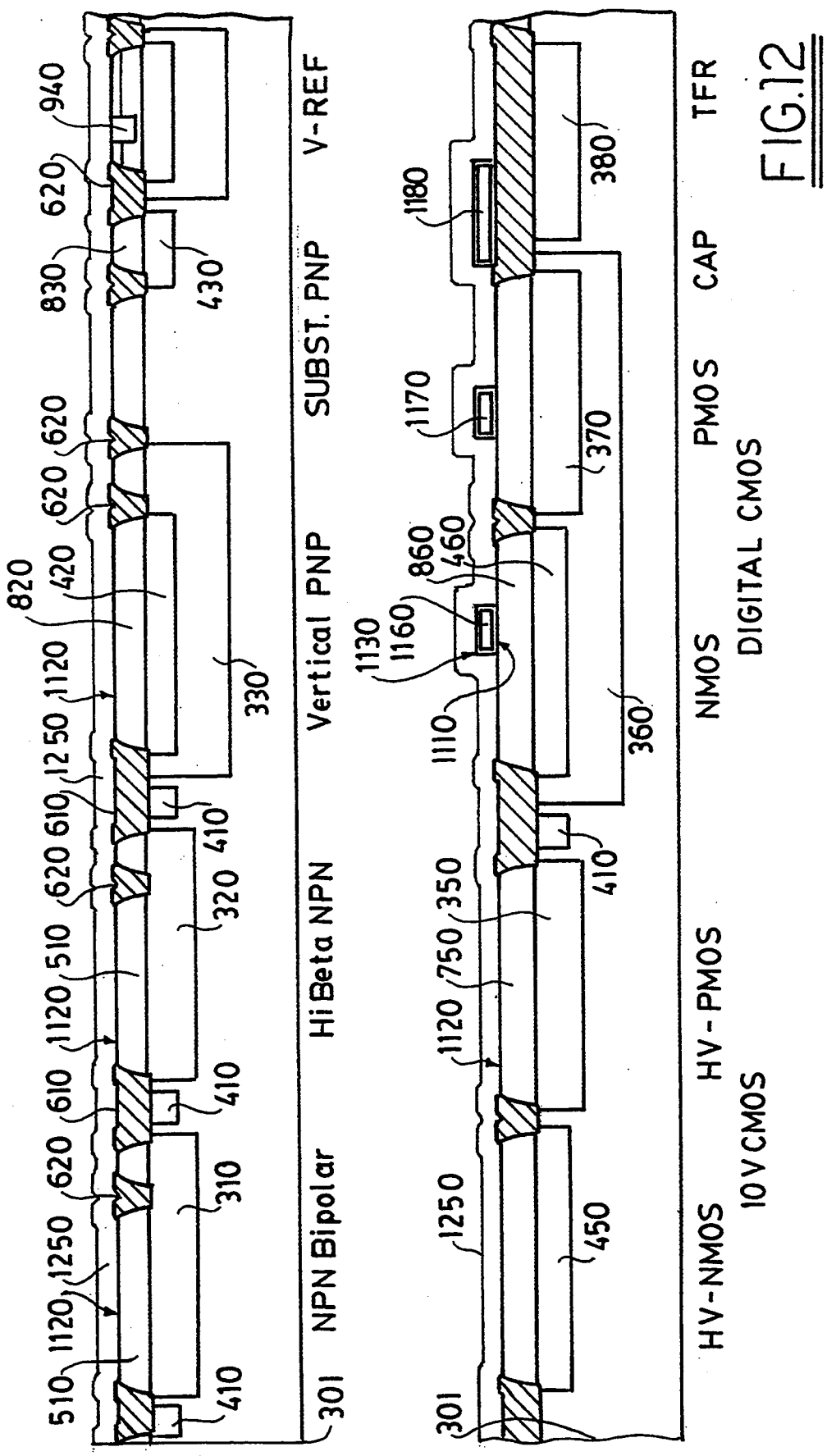

(47) Deposit a second layer of 5500 Å thick undoped polysilicon on coated wafer 301 with LPCVD using silane decomposition. See FIG. 12 showing second polysilicon layer 1250. Note that steps (38)–(41) could have been omitted above and inserted here using polysilicon 1250 in place of polysilicon 1010.

(48) Dope second polysilicon layer 1250 with phosphorus by decomposing $POCl_3$ at 890 C. The resulting resistivity of the doped polysilicon is about 11 ohms/square.

(49) Spin a 1.5 μm thick layer of photoresist onto coated wafer 301, and expose and develop a pattern in the photoresist defining the analog NMOS and PMOS device gates and interconnection lines plus the top plates of the poly-to-poly capacitors. The gates have nominal lengths of 2.0 μm.

(50) Plasma etch the polysilicon with $SF_6$ and $O_2$ or HBr and $Cl_2$ using the patterned photoresist as an etch mask. This selectively etches polysilicon and effectively stops on oxide, so an overetch to guarantee removal polysilicon will also not etch significantly down into wafer 301; however, the 300 Å second gate oxide 1120 not protected by the patterned photoresist plus polysilicon will be partially removed, and the 900 Å oxide 1130 on first polysilicon will be slightly thinned.

Figure 13:
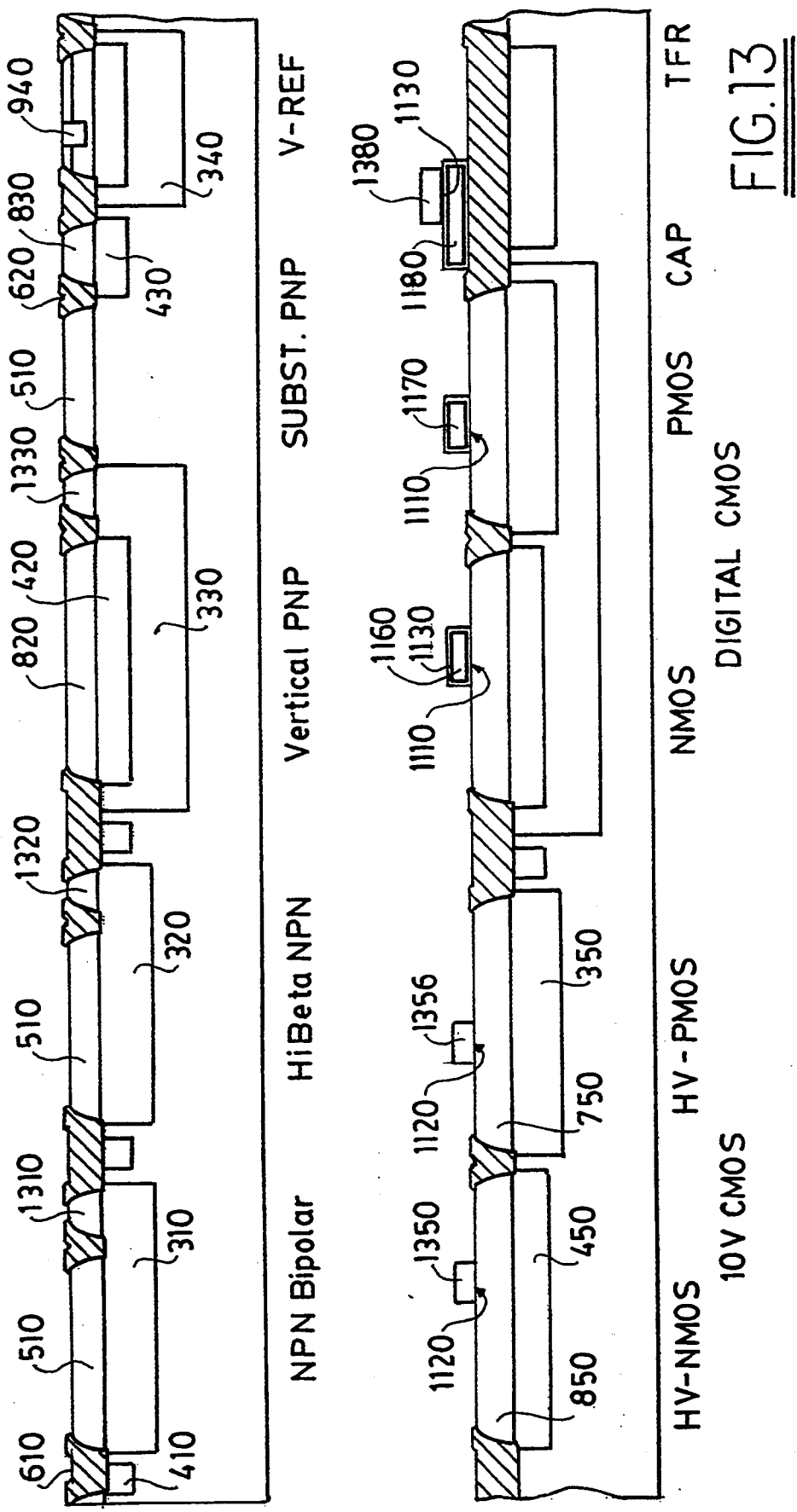

(51) Strip the patterned photoresist with piranha. FIG. 13 shows the resulting analog NMOS and PMOS gates 1350 and 1356, respectively, on 300 Å second gate oxide 1120 and poly-to-poly capacitor with top plate 1380 separated from lower plate 1180 by 900 Å oxide 1130. FIG. 13 also shows deep N+ contacts 1310, 1320, and 1330 that were formed in step (42). If steps (38)–(41) had been moved to follow step (47), then the doping of step (48) would form deep N+ contacts 1310, 1320, and 1330.

(52) Spin a 1.5 μm thick layer of photoresist onto coated wafer 301, and expose and develop a pattern in the photoresist defining the base locations for the isolated PNP devices, the lightly doped drain extensions of the analog NMOS devices, and the Zener cathode regions for the PMOS ESD protection diodes.

(53) Implant phosphorus ions at 160 KeV and a dose of $5.0 \times 10^{13}$ ions/cm$^2$ using the patterned photoresist from step (52) as the implant mask. The projected range of 160 KeV phosphorus is about 2200 Å. The phosphorus dose suffices to convert the upper portion of P well 820 to N type with a doping concentration of roughly $2 \times 10^{18}$ atoms/cm$^3$. Recall that P well 820 has retrograde boron doping, so the remaining P type lower portion of P well 820, which will form the active collector of the isolated PNP, will have retrograde doping.

(54) Strip the patterned photoresist with piranha.

Figure 14:
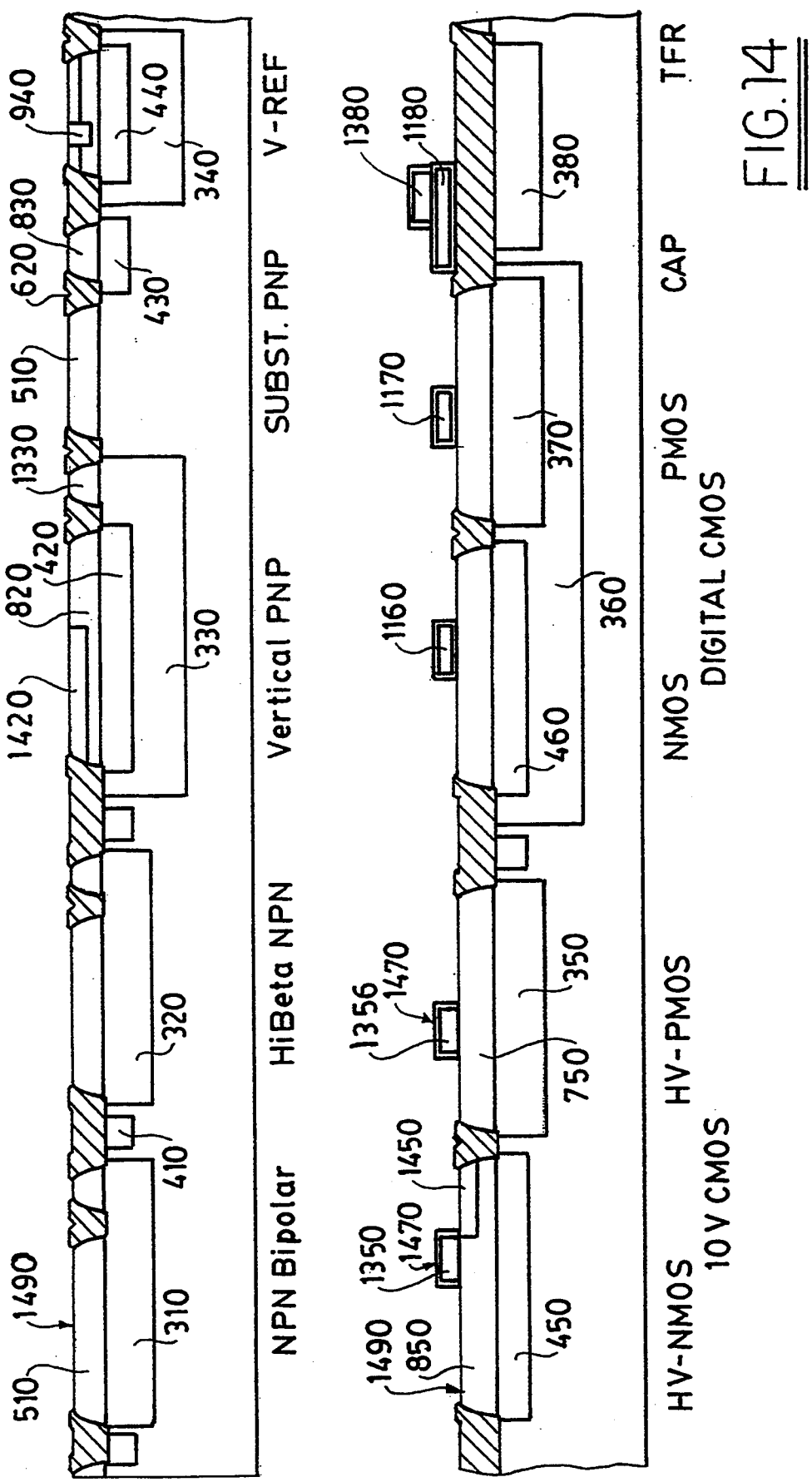
Figure 14A:
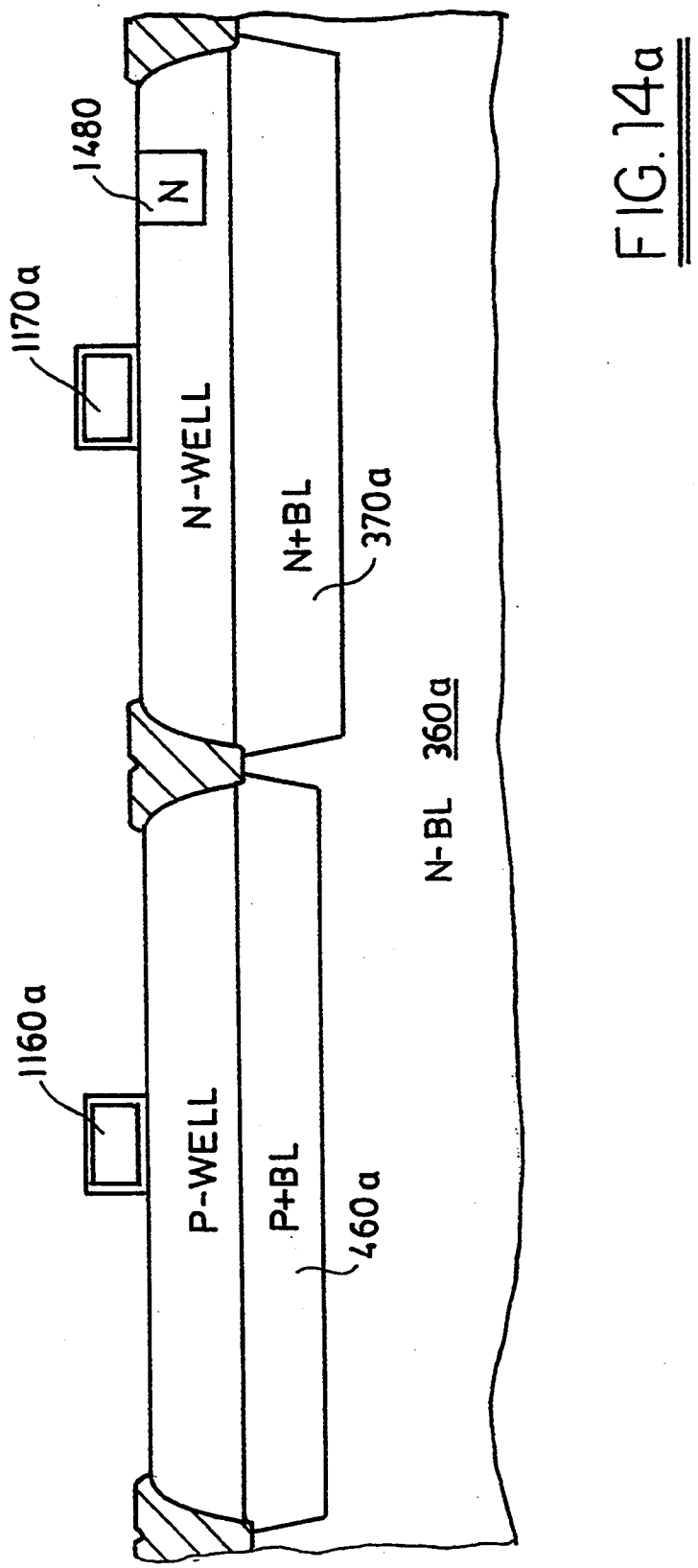
FIG. 14a, 15a, 17a, & 18a are cross-sectional elevation views of steps of a preferred embodiment method of fabrication.

(55) Thermally grow a thin (300 Å) mesa oxide on the exposed surfaces of wafer 301 plus on the exposed surfaces of patterned second polysilicon; this oxide passivates the sidewalls of gates 1350 and 1356. The oxide growth also enhances the thickness of the other oxides. FIG. 14 shows mesa oxide 1490 and sidewall oxide 1470 plus the converted portion 1420 of P well 820 and the drain extension 1450 in P well 850. FIG. 14a shows the special NMOS and PMOS which will have Zener diodes imbedded in their drains for ESD protection. The items in FIG. 14a are labelled with the same reference numerals as for the digital NMOS and PMOS but with an "a" suffix; phosphorus implanted region has reference numeral 1480.

(56) Spin a 1.5 μm thick layer of photoresist onto coated wafer 301, and expose and develop a pattern in the photoresist defining the N+ source/drains needed for the digital NMOS devices, the sources needed for analog NMOS devices, and the N well contacts in both analog and digital PMOS devices.

(57) Implant phosphorus ions at 100 KeV and a dose of $1.0 \times 10^{14}$ ions/cm$^2$ using the patterned photoresist from step (56) as the implant mask. This phosphorus dose will form a deeper and less heavily doped peripheral portion of the source/drains and provide some doping gradient to lessen the maximum electric fields. Note that the projected range for 100 KeV phosphorus ions is about 1200 Å in silicon and easily penetrates mesa oxide 1490.

(58) Implant arsenic ions at 100 KeV and a dose of $5.0 \times 10^{15}$ ions/cm$^2$ using the same patterned photoresist as the phosphorus implant of step (57); this forms the more heavily doped shallower portion of the source/drains. The projected range of 100 KeV arsenic is about 500–600 Å in silicon and oxide. Thus the arsenic implant lies near the surface, and the net donor concentration near the surface will be about $1.5 \times 10^{20}$ atoms/cm$^3$ and at a depth of about 1000 Å the net donor concentration will be about $1.3 \times 10^{20}$ atoms/cm$^3$ at the end of the processing.

Figure 15:
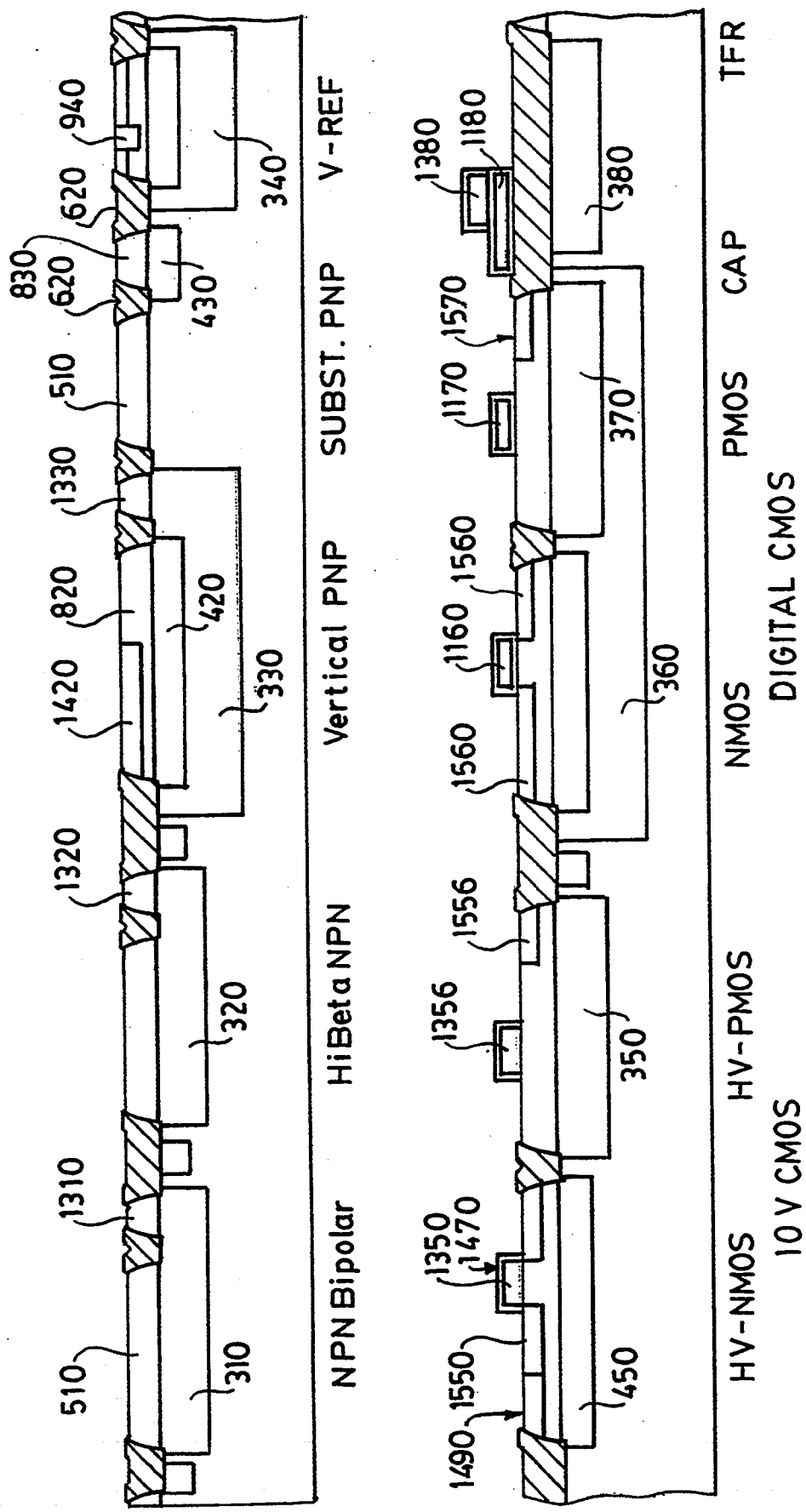
Figure 15A:
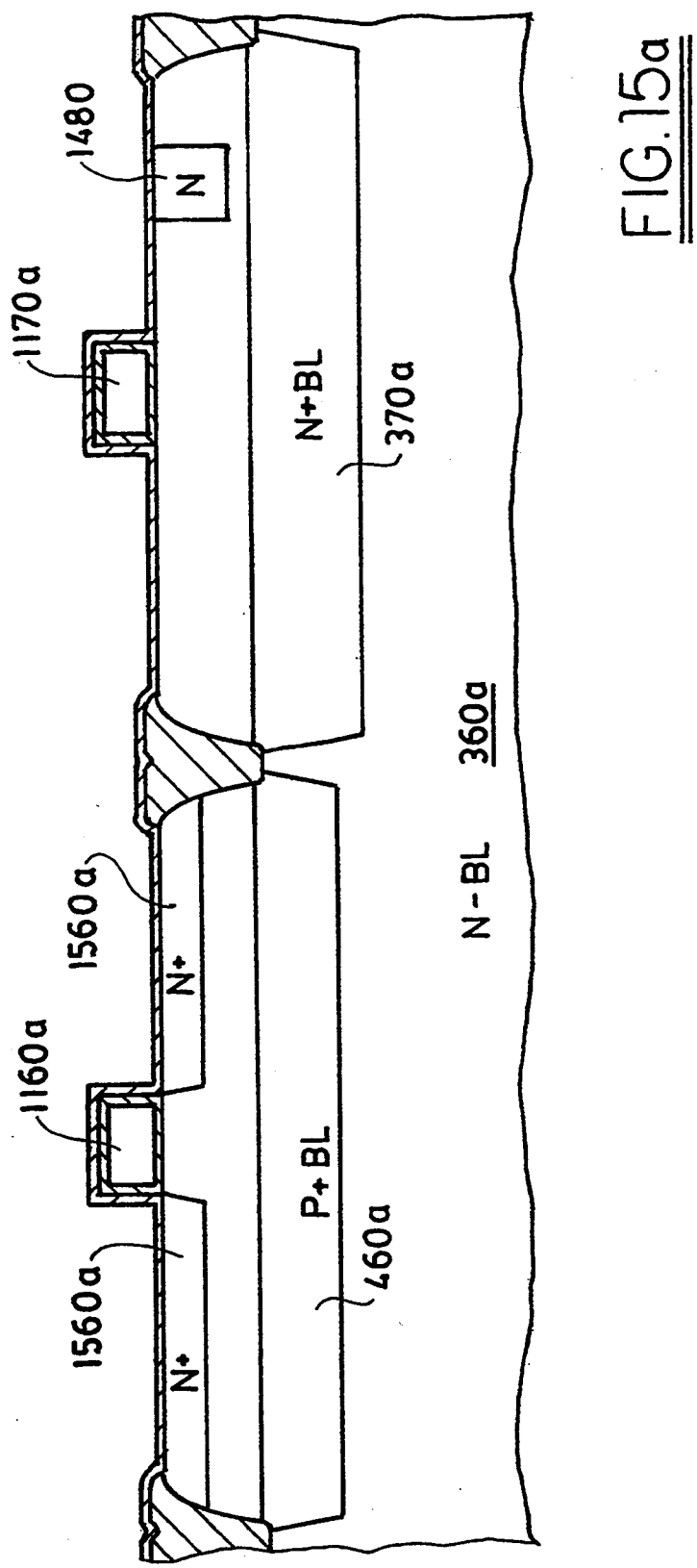

(59) Strip the patterned photoresist by ashing (oxygen burnoff) and piranha. FIG. 15 shows the resulting structure with N+ sources 1550 for analog NMOS devices, N+ well contacts 1556 and 1570 for analog and digital PMOS devices, and N+ source/-drains 1560 for digital NMOS devices. FIG. 15a shows the NMOS and PMOS leading to ESD protection diodes which have all of the fabrication steps of the digital NMOS and PMOS plus the Zener anode and cathode implants, respectively.

(60) Spin a 1.5 μm thick layer of photoresist onto coated wafer 301, and expose and develop a pattern in the photoresist defining the bases for the high beta NPN devices.

(61) Implant boron ions at 125 KeV and a dose of $6.0 \times 10^{12}$ ions/cm$^2$ using the patterned photoresist from step (60) as the implant mask. This boron dose will form a deeper portion of the bases. Note that the projected range for 125 KeV boron ions is about 4000 Å in silicon and easily penetrates mesa oxide 1490 but does not extend to the bottom of N layer 510 which will form the active collector of the high beta NPN.

(62) Implant boron ions at 30 KeV and a dose of $2.0 \times 10^{12}$ ions/cm$^2$ using the same patterned photoresist as the boron implant of step (61); this forms the shallower portion of the base. The projected range of 30 KeV boron is about 1000 Å in silicon and oxide; the resulting doping level in the active base region averages about $1.5 \times 10^{17}$ atoms/cm$^3$ at a depth of about 0.4 μm. Thus the base will have a fairly small dose very deep, much deeper than the emitter to be formed, so the active electrical charge of the base will be formed predominantly with the implant dose control of the implanter and avoid heavy compensation by the emitter as with diffused base devices. This increases the uniformity and decreases the variability of the high beta NPNs from lot to lot and even within a die; indeed, matches within 1–2% are obtained. The shallow boron implant precludes inversion around the emitter but is totally compensated within the emitter and does not contribute a base electrical charge. This also permits independent tailoring of the radiation hardness of the devices.

(63) Strip the patterned photoresist with piranha.

Figure 16:
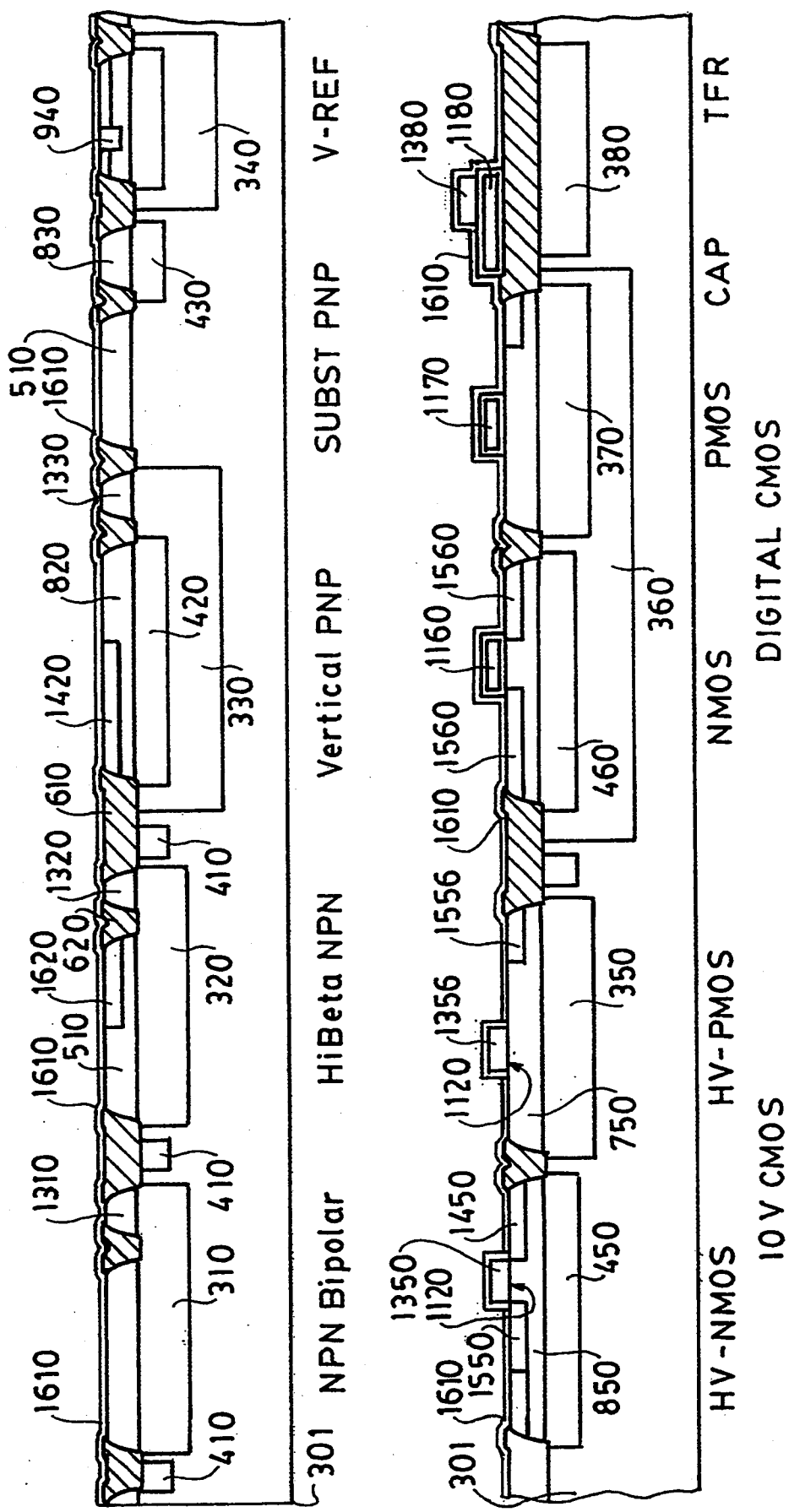

(64) Deposit 2200 Å thick borosilicate glass ("BSG") with CVD by reaction of silane, nitrous oxide, nitrogen, and diborane to yield a glass with boron in the range of 0.5% to 1.5% by weight. Alternately, undoped CVD oxide could be used. The BSG deposits upon the preexisting oxides and brings the total oxide (silicon dioxide plus BSG) thickness on the mesas to about 2500 Å. FIG. 16 shows the resulting H base (P type base for high beta NPN) 1620 in N layer 510 and deposited BSG layer 1610; note that oxide 1490 does not appear separate from BSG 1610. The oxide thickness must be uniform because the active base for the standard NPN devices is implanted through the oxide in step (66) and thus base implant depth and device characteristics uniformity depend upon oxide thickness. The deposition of BSG along with the underlying thermal oxide has a uniformity of about 0.3% of sigma.

(65) Spin a 1.5 μm thick layer of photoresist onto wafer 301, and expose and develop a pattern in the photoresist defining the bases for the standard NPN devices, the lightly doped drain extensions of the analog NMOS devices, and the Zener anode for the NMOS ESD protection diode.

Figure 17:
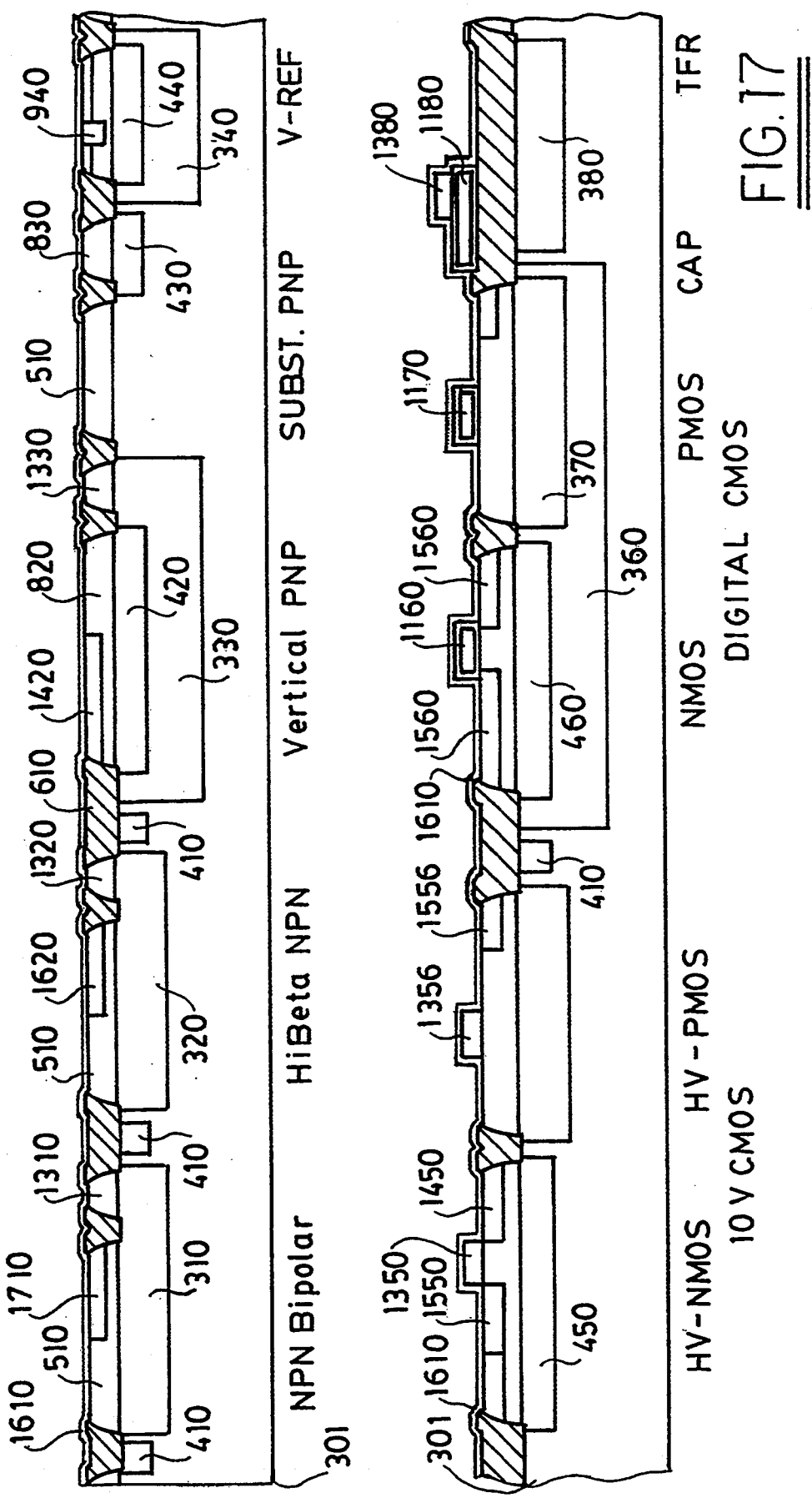
Figure 17A:
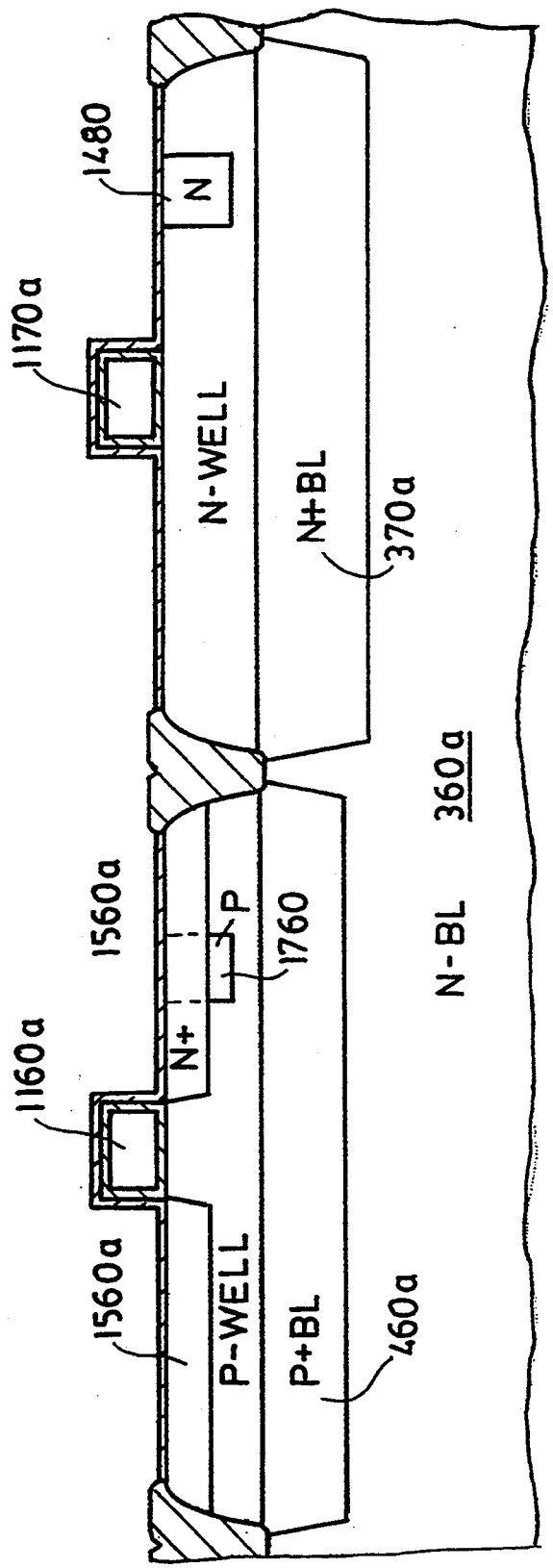

(66) Implant boron ions at 130 KeV and a dose of $4.7 \times 10^{13}$ ions/cm$^2$ using the patterned photoresist from step (65) as the implant mask. Note that the projected range for 130 KeV boron ions is about 4000 Å in silicon and oxide, so after penetrating the 2500 Å thick oxide 1610 the boron travels about 1500 Å into the silicon. This suffices for the Zener anode to be below the NMOS sourcedrain phosphorus implant of step (57) and of a lower dose. Note that the dose exceeds the dose of the high beta NPN, so the standard NPN has a shallower and more conductive base than the high beta NPN. Also, implanting through oxide 1610 insures that crystal damage due to the implant extends to the silicon surface and thus later annealing and crystal regrowth proceeds from the bulk rather than from a surface layer. Also, in the lightly doped drain extensions 1450, the boron compensates much of the phosphorus implanted in step (53) to lower the net N type carrier concentration. FIG. 17 illustrates base 1710 and the now-compensated lightly doped drain 1450, and FIG. 17a shows the ESD protection diode NMOS and PMOS with Zener anode P region 1760 formed by the boron penetrating N+ drain 1560a.

(67) Strip the patterned photoresist with piranha.

(68) Anneal wafer 301 to activate the implants and regrow damaged crystal at 950 C. in a nitrogen atmosphere for 60 minutes.

(69) Spin a 1.5 μm thick layer of photoresist onto wafer 301, and expose and develop a pattern in the photoresist defining the locations of P+ source/drains of both the analog and the digital PMOS devices (including the ESD protection PMOS diode), P well contacts for both the analog and digital NMOS devices, base contacts for both standard and high beta NPN devices, collector contacts and emitters for both isolated and substrate PNP devices, and anode contact for Zener diodes.

(70) Implant boron ions at 100 KeV and a dose of $1.2 \times 10^{15}$ ions/cm$^2$ using the patterned photoresist from step (69) as the implant mask. Note that the projected range for 100 KeV boron ions is about 3000 Å in silicon and oxide with a projected straggle of about 600 Å. Thus the peak of the implant lies near the surface of the silicon under the 2500 Å thick oxide 1610, and high concentrations of boron extend a few hundred Å into the silicon. Thus the implant converts the upper portion of N+ region 1480 (see FIG. 18a) to P+ and leaves N Zener cathode region 1880. This implant also could be used to form substrate resistors with resistivities of about 100 ohms/square. Note that the implant of step (66) which forms the bases for the NPN devices also could be used to form substrate resistors with resistivities of about 1000 ohms/square and the implant of steps (60-62) for bases of high beta NPN devices leads to substrate resistors of about 3000 ohms/square. In contrast, the NiCr resistors made in steps (87-89) and which are laser trimmable form resistors of about 200 ohms/square, and resistors made from the doped polysilicon layers have resistivities of about 12 ohms/square. This indicates that the first preferred embodiment method has a variety of resistivities for resistor fabrication.

Figure 18:
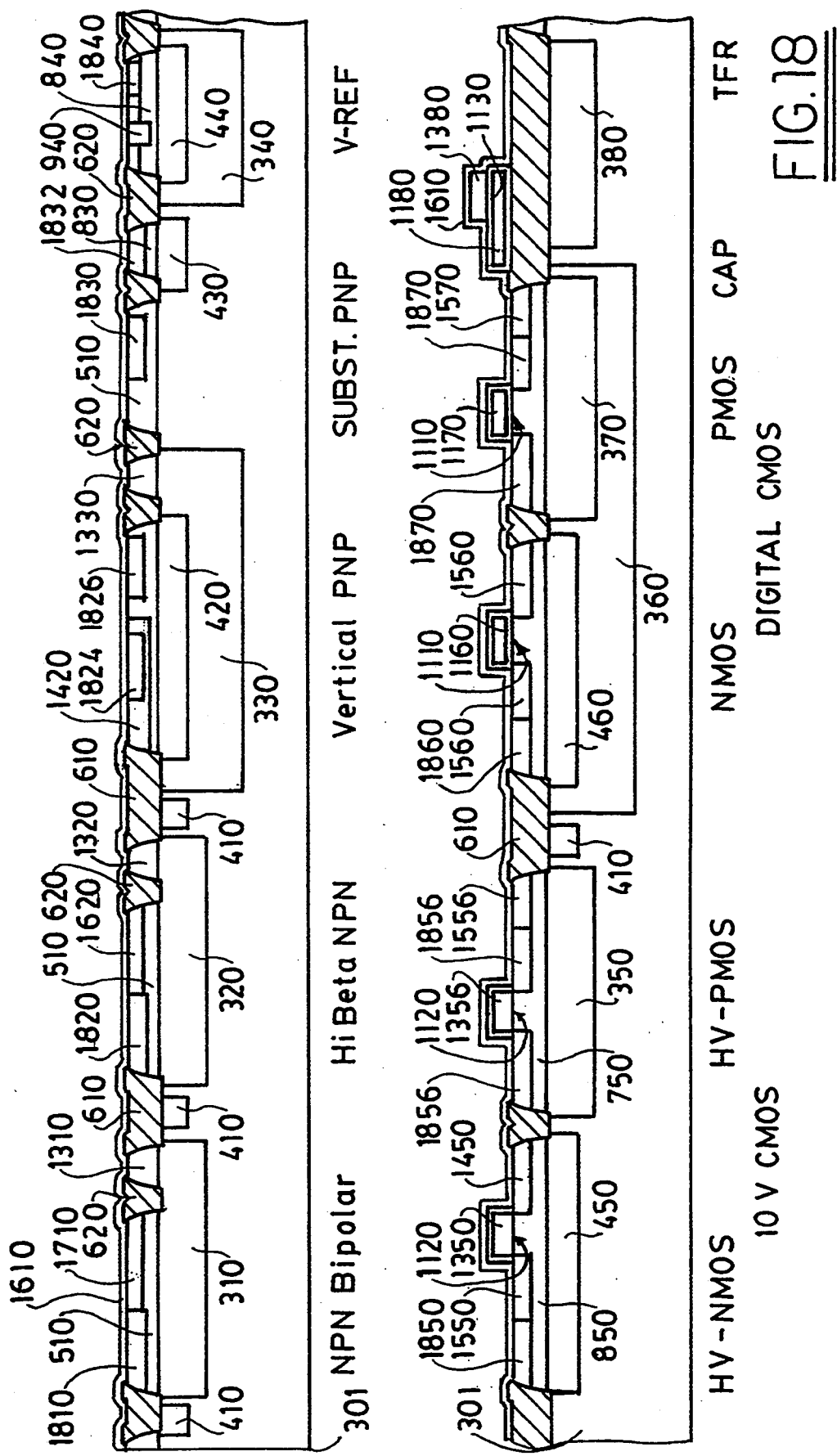
Figure 18A:
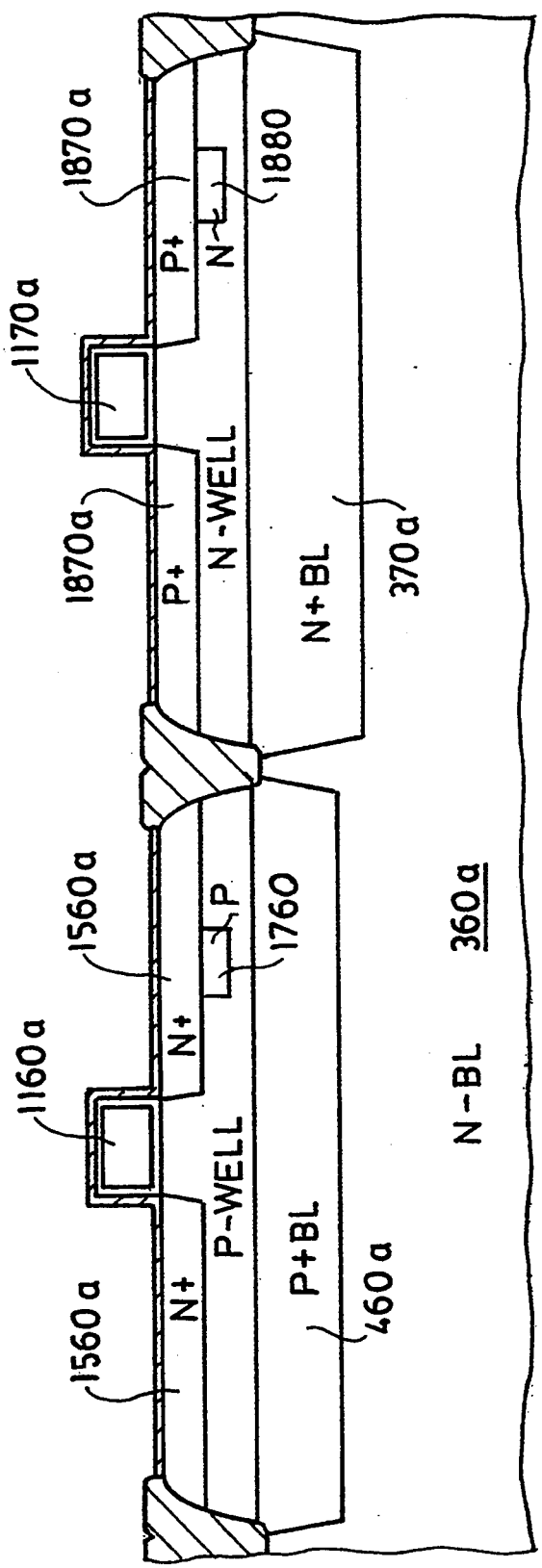

(71) Strip the patterned photoresist with piranha. FIG. 18 shows NPN base contact 1810, high beta NPN base contact 1820, isolated PNP emitter 1824 and collector contact 1826, substrate PNP emitter 1830 and collector contact 1832, separate Zener diode anode contact 1840, analog NMOS well contact 1850, analog PMOS source/drains 1856, digital NMOS well contact 1860, and digital PMOS sourcedrains 1870. FIG. 18a shows the ESD protection diode NMOS and PMOS devices; the remainder of their fabrication follows that of the digital NMOS and PMOS. The Zener anode 1760 and the Zener cathode 1880 simply represent two additional implants in the standard digital NMOS and PMOS fabrication steps.

(72) Deposit 7800 Å thick borophosphosilicate glass ("BPSG") by CVD using silane, nitrous oxide, nitrogen, phosphine, and diborane to yield 2-3% boron and 3.5-4.5% phosphorus by weight. The BPSG deposits upon the preexisting oxides and brings the total oxide (silicon dioxide plus BSG plus BPSG) thickness on the mesas to about 1 μm, and this oxide is called the Field Oxide. The BPSG over planar areas has a thickness variation of only about 0.3%, so the total oxide also has high thickness uniformity.

(73) Densify the BPSG of step (72) in steam at 800 C. for 20 minutes to stabilize the boron and phosphorus dopants. Theoretically, this densification uses the catalytic effect of hydrogen and rapid diffusion of steam to drive the boron and phosphorus dopants to bind to oxygen in the silicon dioxide and thus lessens the outdiffusion of dopants during later processing. That is, the boron and phosphorus in the as-deposited BPSG are primarily elemental, and the steam densification oxidizes the boron and phosphorus. Indeed, the diffusion of elemental dopants from BPSG into the NiCr or other thin-film resistors to be formed later disrupts the resistor stability and degrades the capability of targeting the final value of resistivity. Experimentally, steam densified BPSG released less than about $2 \times 10^{19}$ /cm$^3$ boron into a NiCr thin film, whereas dry densified BPSG released at least about $1 \times 10^{20}$ /cm$^3$ boron into a NiCr thin film. The bonding of the boron and phosphorus to oxygen can be detected, at least in the upper portions of the BPSG layer, by XPS (Xray photospectrometry), FTIR (Fourier transform infrared), or SIMS (secondary ion mass spectroscopy). The densification should convert most of the boron and phosphorus to oxygen-bonded form.

However, steam densification degrades NPN performance, possibly by base grading out to decrease the Early voltage or by dopant segregation at the emitter periphery. Thus densification should be as short as possible and at as low a temperature as possible and still stabilize the dopants. Furthermore, steam densification appears to degrade NMOS hot electron performance if the boron percentage in the BPSG is high and the phosphorus percentage low; whereas if the phosphorus percentage is high and the boron percentage is low, then little degradation occurs. Thus confine the boron to the range of 1% to 3% and have the phosphorus percentage at least 1 higher than the boron percentage. For example, 2.25% boron and 4.5% phosphorus yields good overall results. This steam densification also increases the adherence of the TiW metal deposited in step (91) to the BPSG. Adherence problems for dry densified BPSG may also arise from the out diffusion of dopants.

(74) Spin a 1.5 μm thick layer of photoresist onto coated wafer 301, and expose and develop a pattern in the photoresist defining the contacts to active regions of all devices and also to any substrate resistors.

(75) Plasma etch the oxide with $CHF_3$ and $O_2$ using the patterned photoresist as an etch mask and with endpoint detection. Note that the oxide has various thicknesses, although each of the thicknesses is quite uniform: the deposited oxide is 2150 Å thick, and the BPSG is 7800 Å thick. If the thermal oxide is 350 Å thick in the emitter area, then the thermal oxide would be 2000 Å thick over the collector (an additional 1650 Å), and the thermal oxide would be 1200 Å thick over the first polysilicon gates (an additional 850 Å). This etch selective etches oxide at a rate more than nine times that of silicon, but to clear the oxide over the collector, with endpoint detection etch stop, leads to the removal of 200–300 Å of silicon in the emitter area. This removal is tolerably small because the oxides are uniform and thus require only a minimal overetch. Note that a buffered HF etch generally has better selectively than plasma etches and does not create the crystal damage due to high energy ion impacts of a plasma, but wet etches generally cannot achieve the small geometries for high digital device packing, especially through thick (1 μm) oxides.

Figure 19:
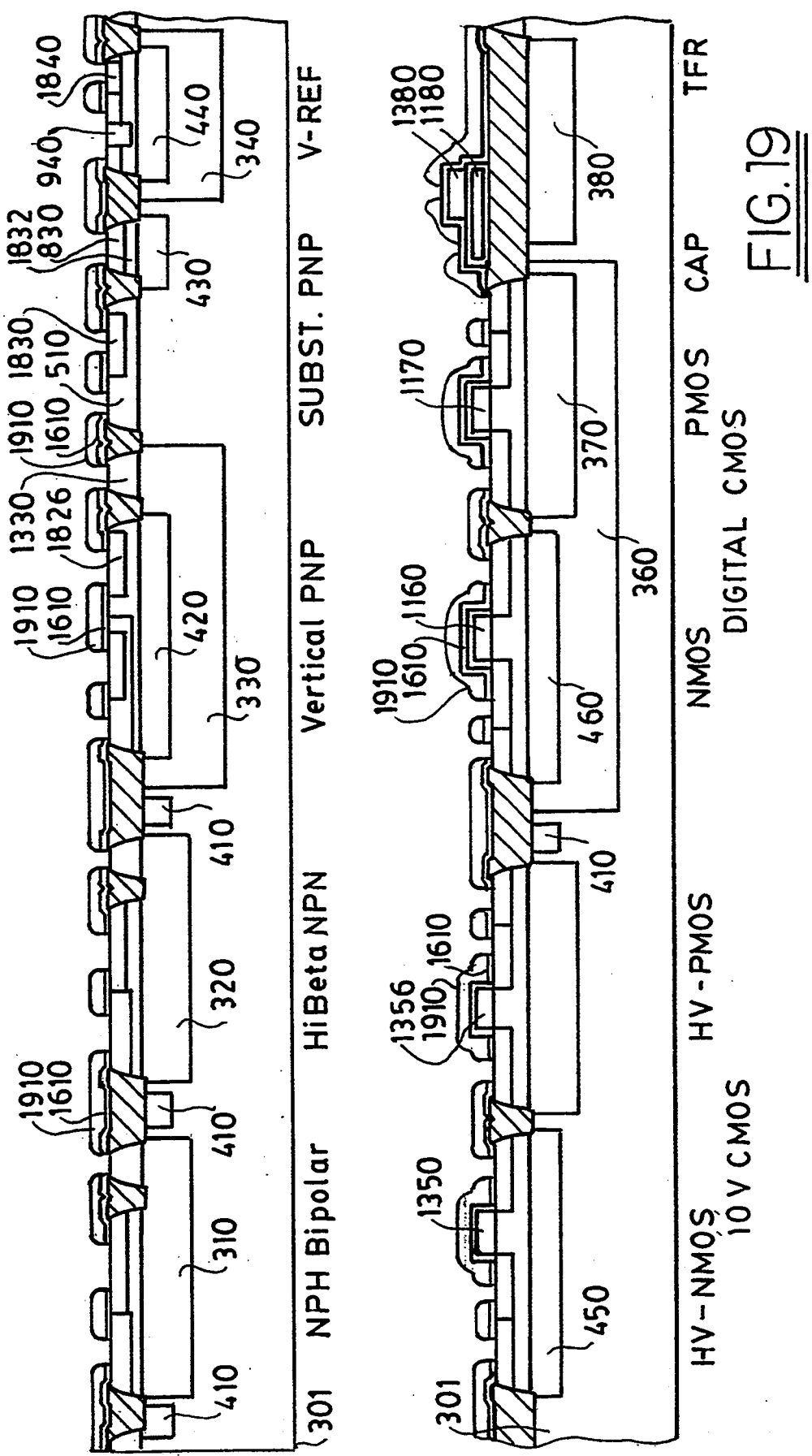

(76) Strip the patterned photoresist with piranha; FIG. 19 shows the resulting BPSG 1910 plus BSG plus thermal oxide with smooth topography plus apertures for contacts.

(77) Spin a 1.5 μm thick layer of photoresist onto coated wafer 301, and expose and develop a pattern in the photoresist defining the locations of N++ which includes the NPN (both standard and high beta) emitters, the tops of deep N+ contacts 1310, 1320, and 1330, the base contact PNPs (both isolated and substrate), the Zener diode cathode, and the contact to the drain of the analog NMOS devices.

Figure 20:
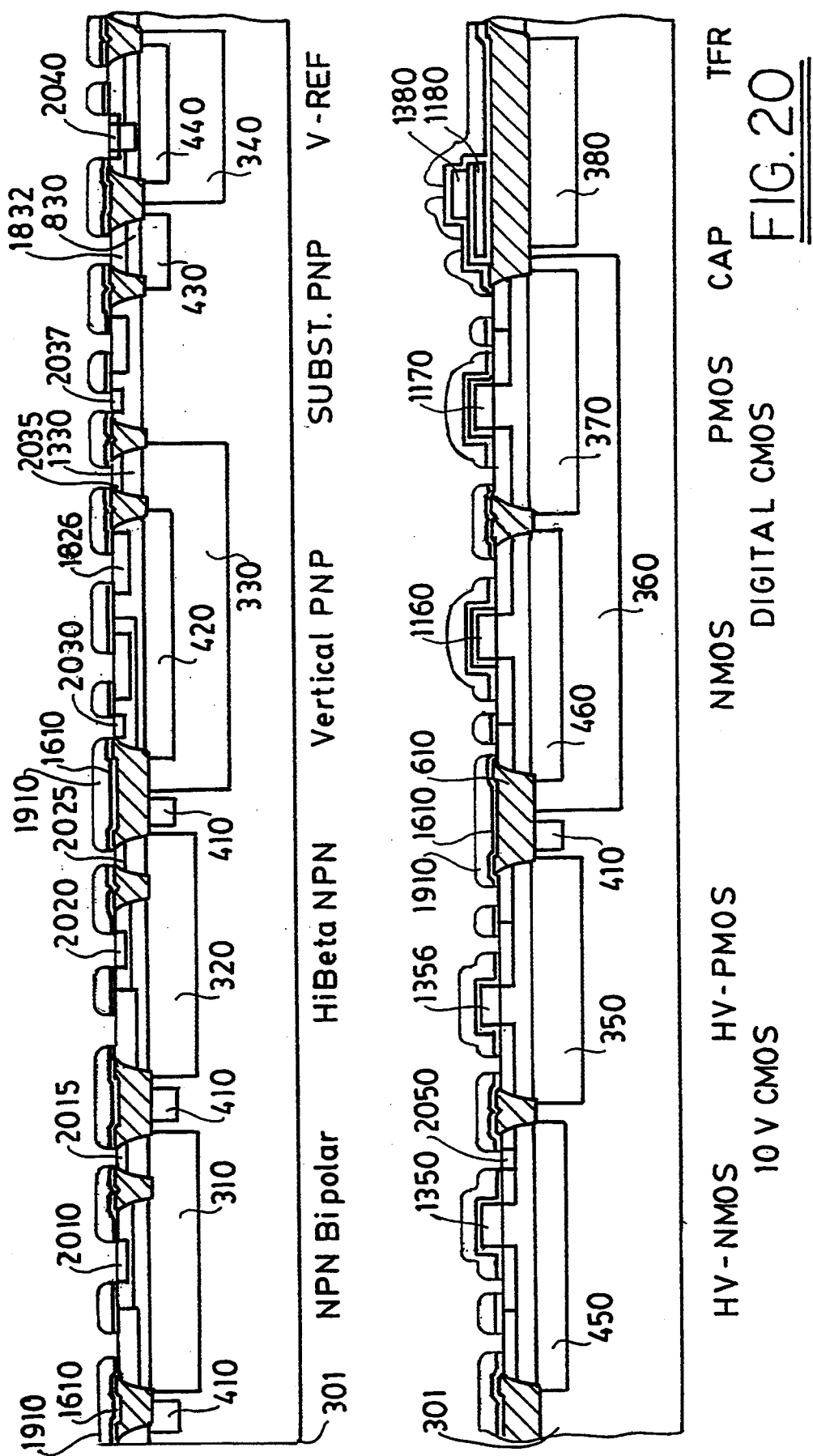

(78) Implant arsenic ions at 80 KeV and a dose of $1.0 \times 10^{16}$ ions/cm$^2$ using the patterned photoresist from step (77) plus the exposed apertured BPSG as the implant mask. Note that the projected range for 80 KeV arsenic ions is about 500 Å in silicon. The N++ emitters formed are called "washed emitters" and are the same size as and self-aligned to the contact apertures in BPSG 1910 created in step (75). N++ also forms enhanced contact regions to other N− type regions like the N base of the PNP transistors. The deep N+ contacts, which cost no diffusion or deposition step, came efficiently at the polysilicon doping Step. This N++ arsenic implant damages the surface of wafer 301 and the resultant defects enhance the diffusivity of the phosphorus previously deposited during the polysilicon doping step. Thus shorter and lower temperature anneals of the base and emitter implants may be used and still diffuse the phosphorus down to the N+ buried layers 310 and 320 plus N buried layer 330. The implanted emitter self-aligns to the contacts apertures from step (75) rather than being nested in conventional analog fabrication. Thus the washed emitter can be the same size as the minimum contact aperture provided by the lithography used and is much smaller than a nested emitter. FIG. 20 shows the N++ implanted regions 2010 (NPN emitter), 2015 (NPN collector contact), 2020 (high beta NPN emitter), 2025 (high beta NPN collector contact), 2030 (isolated PNP base contact), 2035 (contact to buried layer 330), 2037 (base contact for substrate PNP), 2040 (Zener cathode), and 2050 (contact to drain of high voltage NMOS). The hot electron immunity, reduction in ionization current and the snapback holding voltage of the high voltage NMOS can be enhanced by varying the spacing between ohmic contact 2050 and gate 1350.

(79) Strip the patterned photoresist by ashing plus piranha.

(80) Deposit 200 Å thick cap oxide with CVD by reaction of silane, nitrous oxide, and nitrogen at 400 C. The oxide deposits upon both the exposed silicon in the apertures formed during step (75) and the preexisting oxides (BPSG 1910 on mesa oxide 1610). The cap oxide provides a barrier against autodoping during the arsenic implant activation anneal to follow in step (81). Without cap oxide, dopants would diffuse out of the BPSG (which is about 2.25% boron oxide and 4.5% phosphorus oxide) and into the exposed silicon.

(81) Anneal coated wafer 301 at 1,000 C. in a nitrogen atmosphere for 8 minutes (general 950–1050 C. for 5–30 min). This anneal activates and diffuses the arsenic implants of step (78) to a depth of 0.3 μm plus flows the BPSG 1910 to smooth out the corners of the apertures etched in step (75) and over poly lines.

(82) Etch the cap oxide with buffered HF; this opens the bottoms of the apertures in BPSG 1910 and mesa oxide 1610. Note that the cap oxide (deposition in step (80) and removal in this step) could be omitted if autodoping during the anneal to activate the emitter implants does not push device characteristics out of an acceptable range.

(83) Sputter deposit a 220 Å thick layer of platinum onto coated wafer 301.

(84) Sinter platinum-covered coated wafer 301 in a nitrogen atmosphere at 450 C. for 50 minutes. The platinum which deposited upon the silicon exposed by the apertures of step (75) reacts with the silicon to form platinum silicide (PtSi), whereas the platinum which deposited upon the BPSG does not react because silicon dioxide, phosphorus, and boron are all more electropositive than platinum and will not be reduced by the platinum. Note that PtSi forms on both P type and N type silicon and both single crystal silicon and polysilicon, so all contacts to silicon will have a PtSi interface. PtSi has a high conductivity of 6–8 ohms/square for a thin (<500 Å) layer, and a low barrier to P-type silicon.

(85) Strip the unreacted platinum while leaving the PtSi with a wet etch using aqua regia (HCl plus $HNO_3$) which dissolves platinum by forming soluble platinum chlorides.

(86) Spin a 1.5 μm thick layer of photoresist onto coated wafer 301, and expose and develop a pattern in the photoresist defining the locations for nickel chromium (NiCr) thin film resistors on top of BPSG 1910.

(87) Wet etch, with buffered HF, the surface of the oxide (BPSG 1910) exposed through the openings in the patterned photoresist to slightly undercut the photoresist. The undercut insures that the subsequent deposited NiCr does not build up at the vertical photoresist edges of the exposed oxide and prevent a clean lift-off.

(88) Sputter deposit a 100 Å thick layer of NiCr (60% Ni and 40% Cr) onto photoresist covered coated wafer 301. This NiCr film is so thin that it does not cover the sidewalls of the openings in the patterned photoresist but rather just covers horizontal surfaces; namely, the exposed BPSG in the photoresist openings and the top surface of the photoresist.

(89) Lift-off the patterned photoresist by dissolving it in a solution of acetone, methanol, and deionized water. This also lifts off the NiCr that deposited upon the top surface of the photoresist but does not affect the NiCr deposited upon BPSG 1910.

Figure 21:
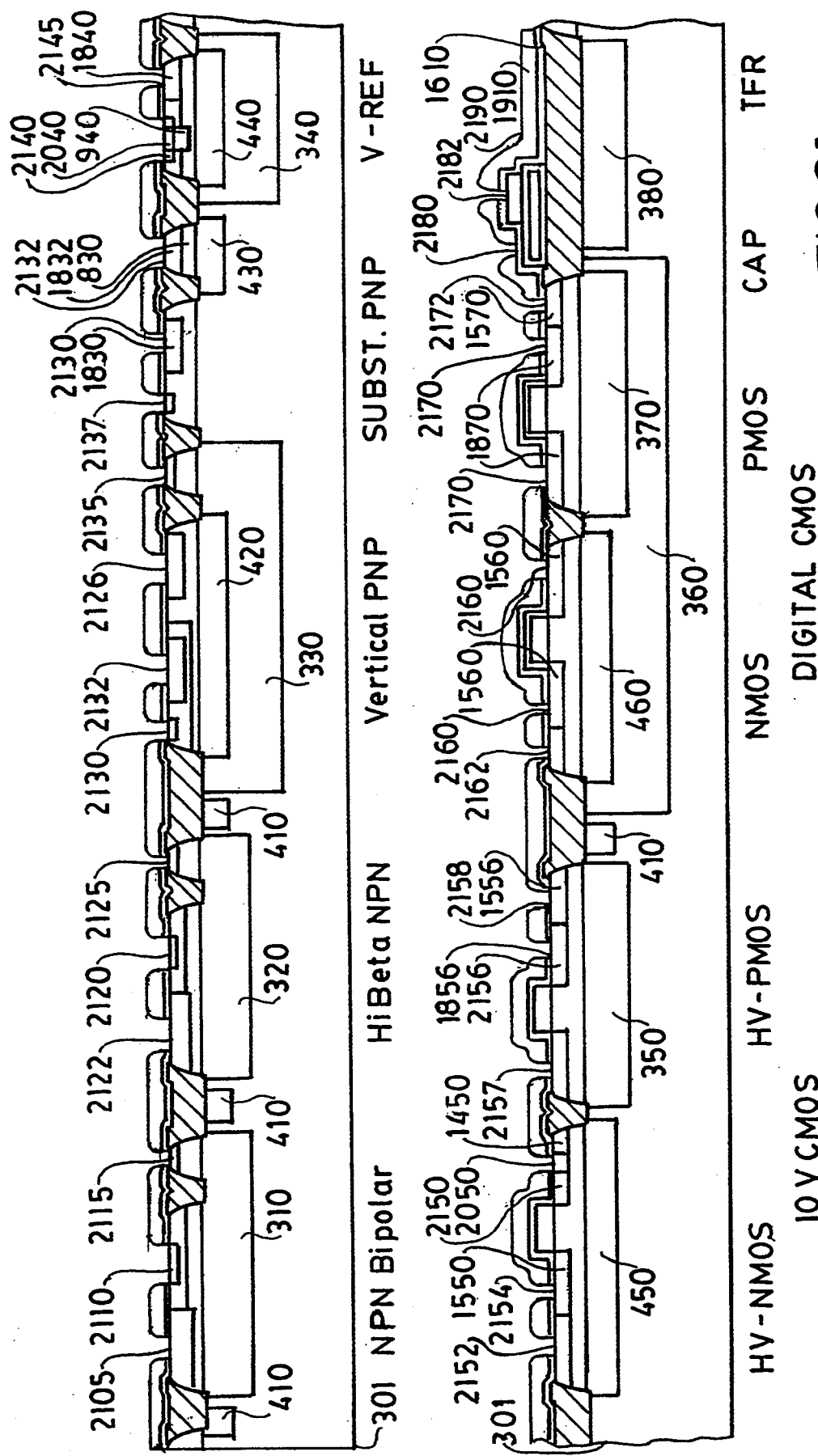

(90) Strip any remaining patterned photoresist with organic solvent such as AZ300T. Note that the entire lift-off process could have been achieved with an organic solvent such as AZ300T alone, eliminating step (89). FIG. 21 shows PtSi interfaces 2105-2182 and NiCr resistors 2190.

(91) Sputter deposit a 1700 Å thick layer of titanium tungsten (TiW which is basically tungsten with about 10% titanium added for adhesion) and then sputter deposit a 6,000 Å thick layer of copper silicon aluminum (about 1% copper and 12% silicon with the copper added to suppress hillocking and the silicon about the saturation limit). These two layers form the first metal level and may include local interconnections. Adhesion is also promoted by the previous steam densification of BPSG 1910.

(92) Spin on photoresist and expose and develop it to define locations over the PtSi interfaces and contacts to the NiCr resistors.

(93) Plasma etch the copper silicon aluminum with $Cl_2$ plus $BCl_3$ using the patterned photoresist as the etch mask. This plasma etch permits high packing density because it avoids the undercut and line width decrease of wet etches. The plasma etch proceeds very slowly in TiW and the etch is terminated before penetration of the TiW. Thus the TiW effectively protects the underlying thin NiCr from plasma etch damage and subsequent change of resistivity.

(94) Strip the patterned photoresist with organic solvent such as AZ300T.

Figure 22:
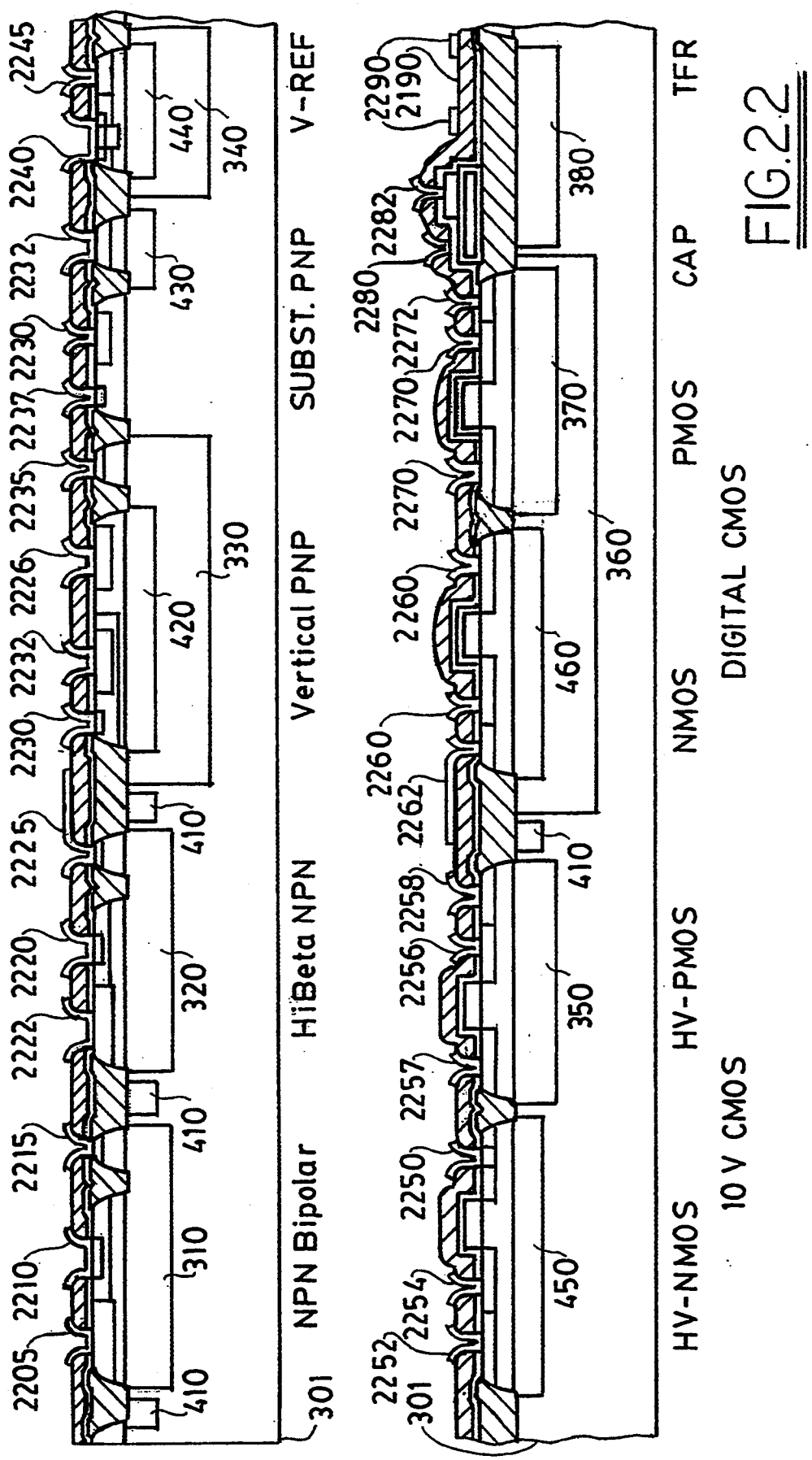

(95) Wet etch the exposed TiW with $H_2O_2$ which selectively stops etching at NiCr, BPSG, and aluminum. Indeed, the copper silicon aluminum remaining from the plasma etch of step (93) protects the underlying TiW except at the film edges where some undercutting occurs. Because the TiW is only 1700 Å thick, the undercut can be held to 2550 Å even with a 50% overetch. FIG. 22 illustrates the patterned first level metal contacts 2205-2290.

(96) Deposit 2.3 μm thick interlevel oxide 2310 by CVD from reaction of TEOS and oxygen at 390 C. to cover the first level metal, NiCr resistors 2190 and BPSG 1910. The interlevel oxide will provide the interlevel dielectric between the first and second metal levels, but the upper surface of the oxide has topography roughly reflecting the bumpiness of the underlying first level metal which has 8000 Å high dropoffs.

(97) Sinter at 475 C. in forming gas (75% $N_2$ plus 25% $H_2$); this reduces contact resistance of the first level metal to PtSi to silicon.

(98) Spin on 1.5 μm thick photoresist and expose and develop it to define locations over the first level metal for vias to second level metal. Note that the photoresist covers the bumpiness of the interlevel dielectric but has an essentially flat top surface except for the patterned vias.

(99) Plasma etch the interlevel dielectric 2310 with the via patterned photoresist as the etch mask using $CHF_3$ plus $O_2$ which etches both the interlevel dielectric and the photoresist. Thus the via pattern persists through the interlevel dielectric and the planar surface of the patterned photoresist propagates to planarize the interlevel dielectric surface; however, the isotropic nature of the etch broadens the vias and slopes their sidewalls. The etch stops in the vias when it reaches first level metal except for the lateral etching; thus the depths of the vias can vary to accommodate variation in the thickness of the interlevel dielectric. The etch is timed and stopped to insure a minimum thickness of at least 0.5 μm of interlevel dielectric at its thinnest portion, which occurs over the poly-to-poly capacitors due to the stacked polysilicon layers.

(100) Strip any remaining patterned photoresist with organic solvent.

(101) Sputter deposit a 1.6 μm thick layer 2320 of silicon aluminum (1% silicon) on the planarized interlevel dielectric 2310 for second level metal. The second level metal covers the sloped sidewalls of the vias in the interlevel dielectric to connect to the first level metal exposed at the bottoms of the vias. Bond pads are formed in second level metal.

(102) Spin on photoresist and expose and develop it to define the second level metal interconnections.

(103) Plasma etch the silicon aluminum 2320 with $Cl_2$ plus $BCl_3$ and $CHF_3$ using the patterned photoresist as the etch mask.

(104) Strip the patterned photoresist with a plasma of oxygen plus a follow up wet strip with organic solvent as a clean up.

Figure 23:
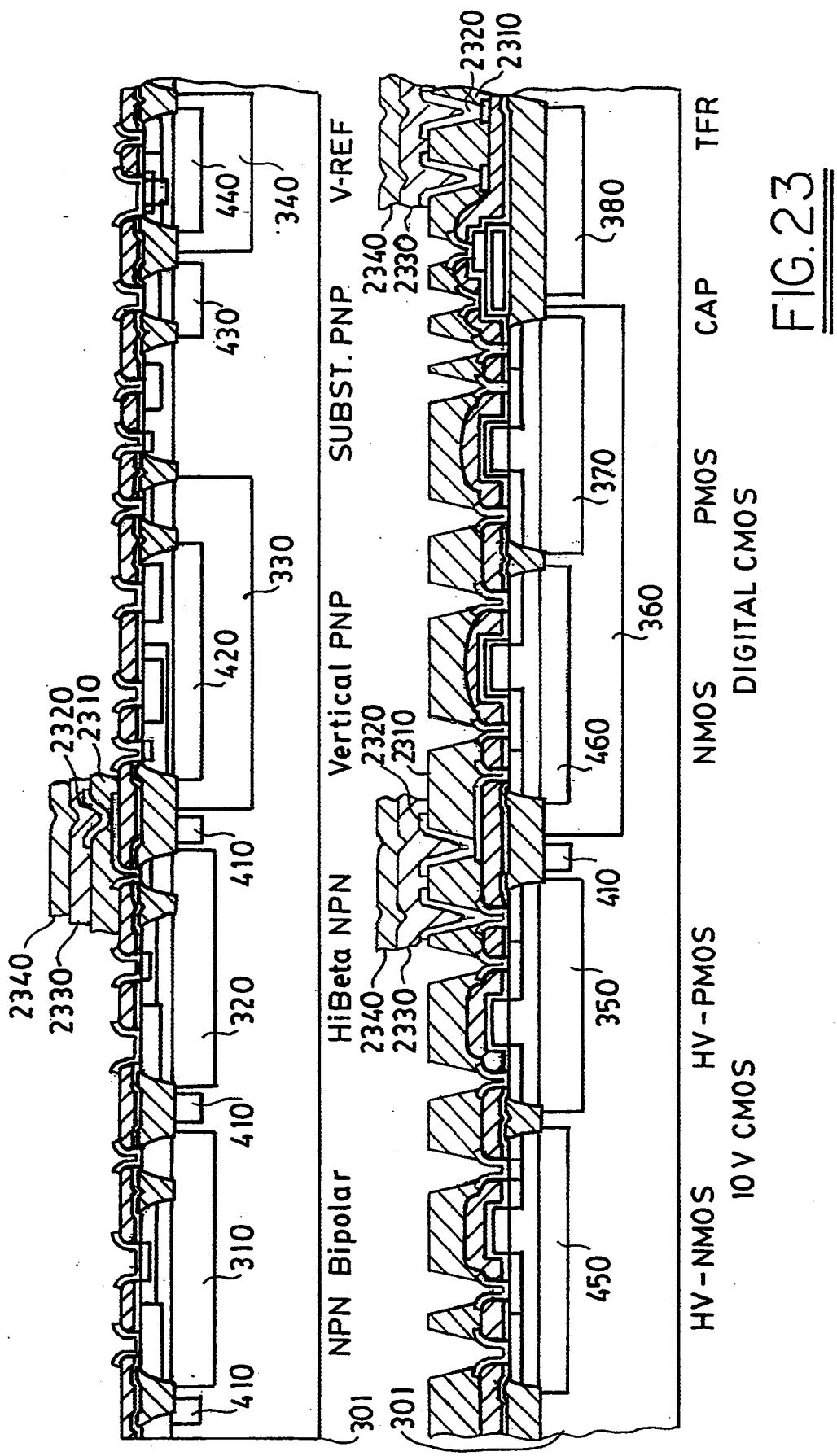

(105) Deposit 0.8 μm thick oxide 2330 by reacting TEOS plus oxygen with the middle 0.6 μm doped with phosphorus. Then deposit 0.4 μm thick silicon nitride 2340. The oxide and nitride will form the passivation layer, which has a total thickness, including the interlevel oxide from step (96), of about 2.2 μm over NiCr resistors 2190. A plasma reaction of silane with ammonia and nitrogen using dual RF (13 MHz and 600 KHz) deposits nitride with a low hydrogen and low Si—H bond content to improve subsequent laser trimming results. Typical nitride films have 30% (atomic percent measured) total hydrogen and 20% Si—H bonded hydrogen, whereas nitride 2340 has only 20% total hydrogen and 12% Si—H bonded hydrogen. Hydrogen not Si—H bonded is usually N-H bonded and stable, so the reduction of Si—H bonded hydrogen by about a factor of two provides laser trimming benefits noted in the following. See FIG. 23 showing interlevel oxide 2310, second level metal 2320, passivation oxide 2330, and passivation nitride 2340.

(106) Sinter at 475 C. in a nitrogen atmosphere to reduce the via resistance.

(107) Spin on photoresist and expose and develop it to define openings to the bond pads.

(108) Plasma etch nitride 2340 with $CF_4$ and wet etch oxide 2330 with buffered HF down to the bond pads.

(109) Strip the patterned photoresist with organic solvent. This completes the semiconductor processing of wafer 301.

To finish the fabrication: probe die on the wafer; laser trim precision analog circuits including laser trim the NiCr resistors by focussing a laser beam through interlevel oxide 2310, passivation oxide 2330, and nitride 2340 to vaporize portions of the NiCr film; saw wafer 301 into dice; mount the individual dice on lead frames; connect bond wires to the bond pads; electrically test the mounted and bonded dice; and lastly package the trimmed dice.

Breakdown Characteristics

The foregoing fabrication method yields digital NMOS and PMOS transistors plus digital NMOS and PMOS transistors with Zener diodes imbedded in the drains for use as ESD protection diodes. The drain characteristics change due to the imbedded Zener diode as follows:

|  | NMOS | | PMOS | |
| --- | --- | --- | --- | --- |
|  | normal | Zener | normal | Zener |
| Drain breakdown voltage (V) | >12 | 6 | >20 | 9 |
| Depletion region width ($\mu m$) | 0.2 | 0.05 | 0.35 | 0.07 |
| Junction capacitance ($aF/\mu m^2$) | 500 | 2200 | 300 | 1500 |
| Contact resistance ($\Omega\text{-}\mu m^2$) | 50 | 50 | 50 | 50 |

Such imbedded Zener diodes trigger avalanche breakdown in the NMOS and PMOS ESD protection diodes and have the following advantage over NMOS and PMOS diodes alone:

1. The breakdown voltage of the drain-to-body junction of the conventional NMOS and PMOS transistor may be 12 volts or higher as shown in the table above. This value is too large to protect thin gate oxides from voltage stress or rupture. By employing the Zener assisted breakdown device structure, the MOS breakdown voltage is reduced below the gate oxide rupture voltage. There is no area penalty and only a small increase in capacitance.

The imbedded Zener diode has the following advantages over a conventional Zener diode:

1. The series resistance of any ESD structure must be kept small so that the voltage drop across this resistance during the ESD event does not increase above the gate oxide rupture voltage. To satisfy this requirement, the conventional Zener diode must be designed with a significant cross-sectional area. Since the Zener capacitance is proportional to the diodes area, this leads to a large parasitic capacitance on the I/O pad. With respect to the imbedded Zener structure, the actual Zener junction area is quite small since only a small amount of Zener current is necessary to trigger the MOS snapback. Therefore, the extra capacitance seen on the I/O node is significantly less.

2. Zener diodes are notoriously leaky at applied voltages less than the breakdown voltage due to the nature of the breakdown mechanism. This leakage current is also proportional to the area of the diode, so there can be a significant amount of parasitic leakage associated with the conventional Zener diode. Some circuit applications can not tolerate this extra leakage current. By the same arguments given above, the imbedded Zener area is less than a conventional Zener diode so the extra parasitic leakage is small. This leakage current is added to the inherent MOS diode leakage current which is also negligible.

Further Modifications and Variations

The preferred embodiments may be modified in many ways while retaining the feature of imbedded Zener diodes in the ESD protection NMOS and PMOS diodes. For example, varying the energy and dosage of the various implants: this will modify both the Zener and the MOS avalanche characteristics along with the normal MOS and bipolar characteristics. Also, the separate, low noise Zener P+ implant could be used in place of the P base implant for the NMOS imbedded Zener anode if such implant is available. Likewise, it is possible that lightly doped drain (LDD) implants may provide the appropriate junction characteristics if such implants exist in the process.

Figure 24:
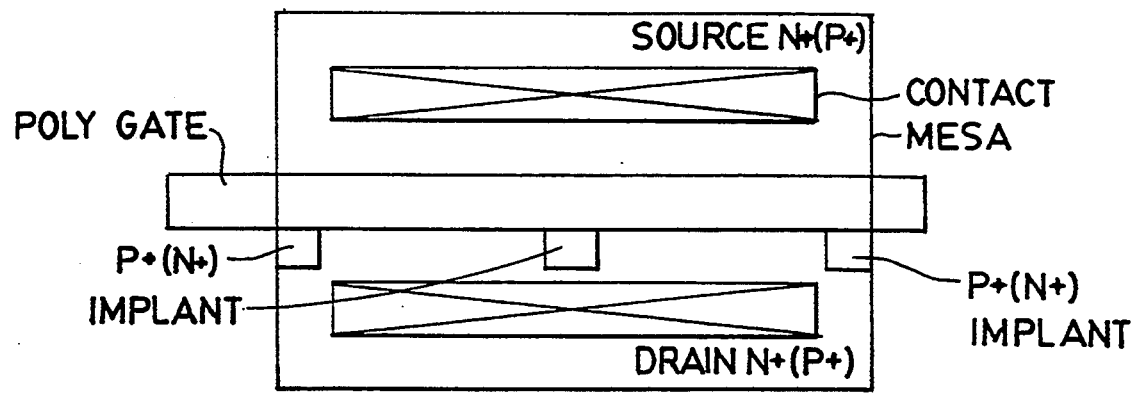
FIGS. 24, 25, 26a–b and 27a–b illustrate additional preferred embodiments.
Figure 25:
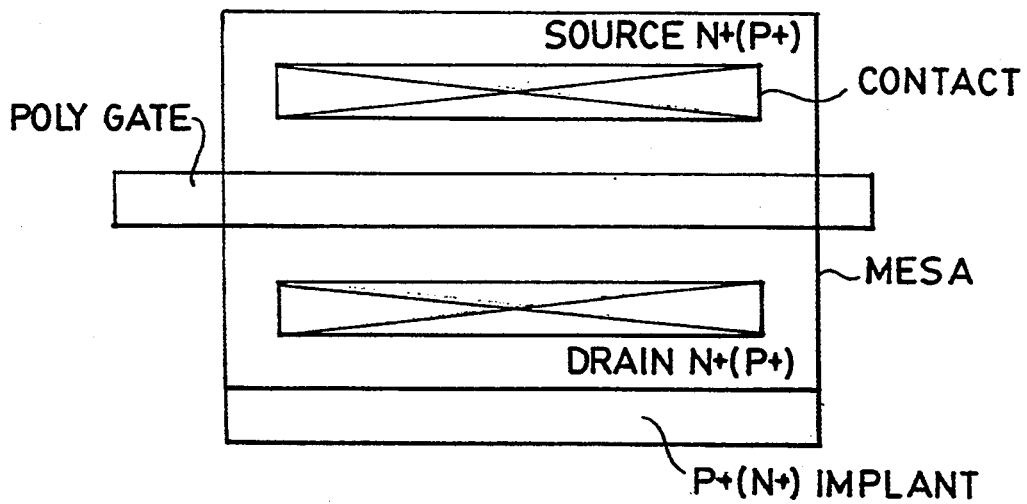
Figure 26A:
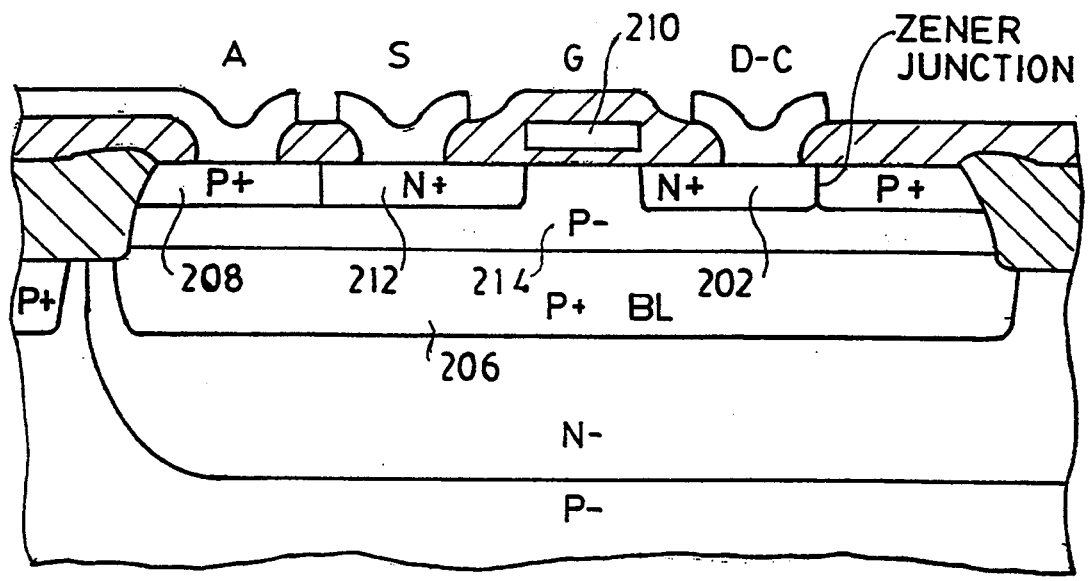
Figure 26B:
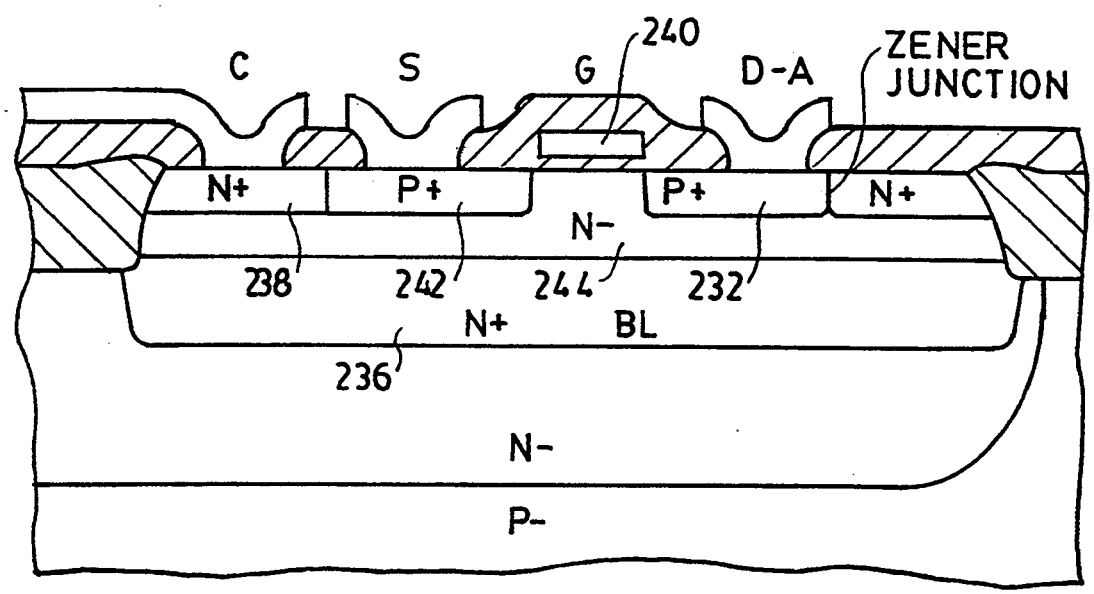

Further, the physical layout of the MOS with imbedded Zener can be varied such as shown in plan view FIGS. 24 and 25. In particular, FIG. 24 shows an NMOS with the Zener anode formed by the PMOS P+ source and drain implant. A P+ implant plug fills a hole left in the N+ drain region providing the imbedded Zener structure. In this configuration, no additional fabrication operations are necessary assuming the P+ to N+ breakdown voltage is large enough to sustain the operating voltage of the circuit. And, this breakdown voltage can be tailored to some extent by adjusting the spacing between N+ and P+. Similarly, the P+ plugs could be replaced by a bar of P+ implant as shown in FIG. 25. This preserves the entire width of the NMOS transistor for maximum current carrying capacity. Analogously, a N+ plug or bar could be included in a hole left in the P+ drain region to yield the PMOS protection diode. Cross-sectional diagrams of the P+/N+ bar option are shown in FIGS. 26a and 26b. Due to the low breakdown voltage of a butting N+/P+ junctions, the junctions in FIG. 26a and 26b are allowed to diffuse together instead of overlapping. Note that the Zener breakdown occurs at the lateral junction where the N+ and P+ regions side-diffuse and meet. This is opposed to the buried planar junction shown is FIGS. 2a and 2b. Note that layouts similar to these are necessary if (1) there are no base, LDD, Zener, etc. implants of both polarities available in the process (2) the extra implants are available but are not deep enough with respect to the corresponding N+ and P+ implants to form a junction of the appropriate breakdown voltage.

Figure 27A:
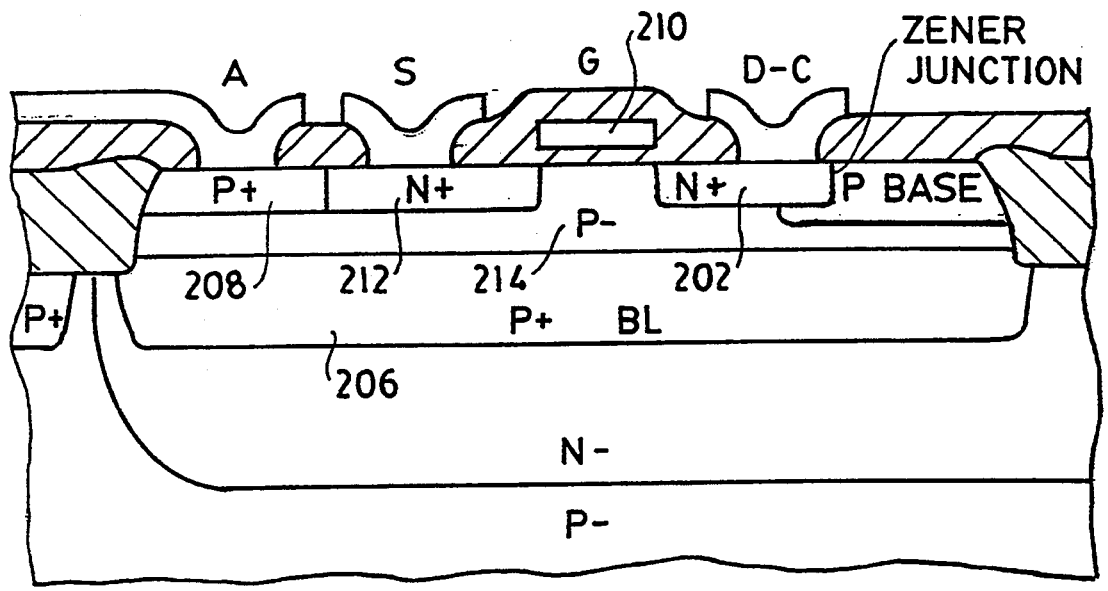
Figure 27B:
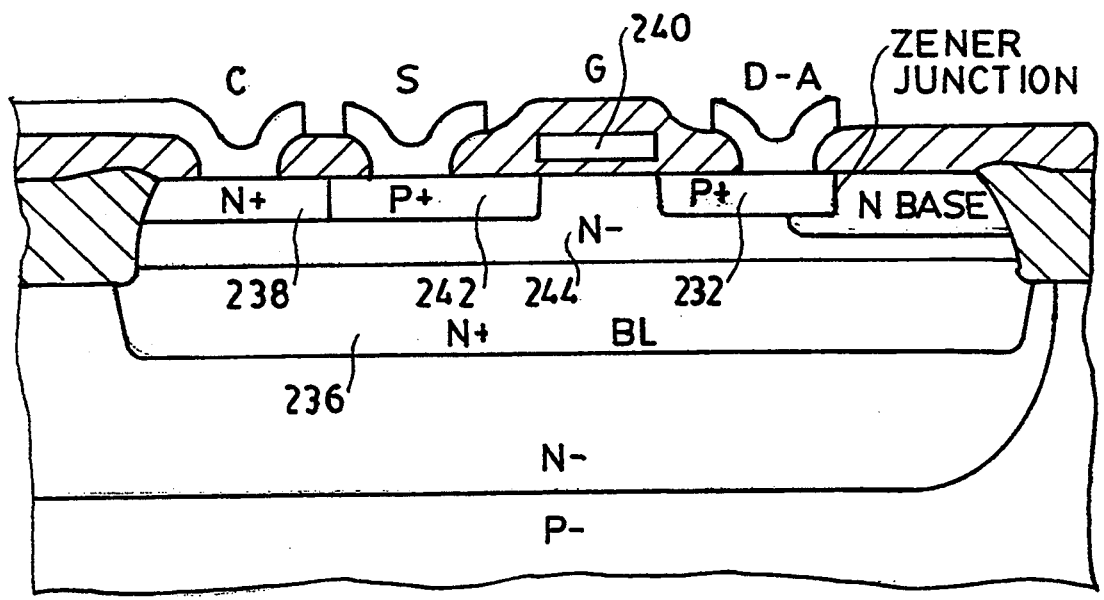

Shown in FIGS. 27a and 27b are other options to achieve diodes with the appropriate breakdown voltage. Suppose the breakdown voltage of the structures in FIGS. 2a and 2b are too large to protect the gate oxide because the planar breakdown voltages of the junctions are too large. This can occur because the doping concentrations the base diffusions are not at their maximum at the metallurgical junction. Instead, the peak concentration occurs nearer to the surface and is counterdoped by the heavily doped N+ or P+. This problem can be solved by relying on a surface breakdown to initiate MOS snapback similar N+/P+ case described above. This possible structure is shown in FIGS. 27a and 27b.

Here the base implants overlap the N+/P+ regions so that the peak concentration of each of the base diffusions is now directly adjacent to the heavily doped N+ or P+. By designing the structure accordingly, a lesser Zener voltage is attainable. The optimum layout used in the Zener imbedded MOS scheme depends on the actual junction depths and peak doping concentrations of the diffusions creating the Zener diode.

What is claimed is:

1. An integrated circuit having an electrostatic discharge (ESD) protection circuit comprising:
   (a) a semiconductor layer having a plurality of interconnected field effect transistors including a first field effect transistor, an input/output terminal and a first reference voltage terminal;
   (b) the first field effect transistor having a source, a drain, a channel disposed between the source and drain and a gate disposed over the channel and insulated therefrom, the source coupled to the input/output terminal, the drain coupled to the first reference voltage terminal and the gate and drain coupled together to form a first ESD protection diode, said first ESD protection diode having a protection diode breakdown voltage between the drain and the channel greater than the reference voltage;
   (c) a first Zener region abutting the drain region of said first transistor to form a Zener diode having a Zener breakdown voltage less than the protection diode breakdown voltage and greater than the reference voltage for coupling the first input/output terminal through the channel of the first field effect transistor to the first reference voltage terminal during Zener breakdown.

2. The integrated circuit of claim 1 wherein the first Zener region is smaller than the abutting drain region.

3. The integrated circuit of claim 1 further comprising:
   (d) a second reference voltage terminal;
   (e) a second field effect transistor having a source, a drain, a channel disposed between the source and drain and a gate disposed over the channel and insulated therefrom, the source coupled to the input/output terminal, the drain coupled to the second reference voltage terminal and the gate and drain coupled together to form a second ESD protection diode, said second ESD protection diode having a second protection diode breakdown voltage between the drain and the channel greater than the second reference voltage;
   (e) a second Zener region abutting the drain region of said second transistor to form a second Zener diode having a second Zener breakdown voltage less than the first protection diode breakdown voltage and greater than the second reference voltage for coupling the second input/output terminal through the channel of the second field effect transistor to the second reference voltage terminal during Zener breakdown.

4. The integrated circuit of claim 3 wherein the second Zener region is smaller than the abutting drain region.

5. The circuit of claim 3, further comprising:
   (a) a bipolar transistor in said semiconductor layer;
   (b) wherein one of said Zener regions has doping profile the same as a base of said bipolar transistor.

6. An electrostatic discharge protection in an integrated circuit, comprising;
   (a) a semiconductor layer having a plurality of interconnected field effect transistors including a first field effect transistor, an input/output terminal and a first reference voltage terminal;
   (b) the first field effect transistor having a source, a drain, a channel disposed between the source and drain and a gate disposed over the channel and insulated therefrom, the source coupled to the input/output terminal, the drain coupled to the reference voltage terminal and the gate and drain coupled together to form a first ESD protection diode, said first ESD protection diode having a protection diode breakdown voltage between the drain and the channel greater than the reference voltage;
   (c) a first Zener region abutting the drain region of said first transistor to form a Zener diode having a Zener breakdown voltage less than the protection diode breakdown voltage and greater than the reference voltage for coupling the first input/output terminal through the channel of the first field effect transistor to the first reference voltage terminal during Zener breakdown;
   (d) a NPN bipolar transistor formed in said semiconductor layer, and
   (e) wherein said first Zener region has the doping profile of a base of said NPN transistor.

7. An electrostatic discharge protection in an integrated circuit, comprising;
   (a) a semiconductor layer having a plurality of interconnected field effect transistors including a first field effect transistor, an input/output terminal and a first reference voltage terminal;
   (b) the first field effect transistor having a source, a drain, a channel disposed between the source and drain and a gate disposed over the channel and insulated therefrom, the source coupled to the input/output terminal, the drain coupled to the reference voltage terminal and the gate and drain coupled together to form a first ESD protection diode, said first ESD protection diode having a protection diode breakdown voltage between the drain and the channel greater than the reference voltage;
   (c) a first Zener region abutting the drain region of said first transistor to form a Zener diode having a Zener breakdown voltage less than the protection diode breakdown voltage and greater than the reference voltage for coupling the first input/output terminal through the channel of the first field effect transistor to the first reference voltage terminal during Zener breakdown;
   (d) a PNP bipolar transistor formed in said semiconductor layer, and
   (e) wherein said first Zener region has the doping profile of a base of said PNP transistor.

8. An integrated circuit, comprising:
   (a) a semiconductor layer having a plurality of NMOS transistors formed in the semiconductor layer, a first input/output terminal and a first reference voltage terminal, each of said NMOS transistors with a N+ source region and a N+ drain region in a P region; and
   (b) a first ESD protection diode formed in said semiconductor layer and connected between said first input/output terminal and said first reference voltage terminal, said diode including a first NMOS transistor having a N+ source, a N+ drain, a P channel disposed between the source and drain and a gate disposed over the P channel and insulated therefrom, the source coupled to the input/output terminal, the drain coupled to the first reference voltage terminal and the gate and drain coupled together to form a first ESD protection diode, said first ESD protection diode having a protection diode breakdown voltage between the drain and the channel greater than the reference voltage;

(c) a first Zener region abutting both said N+ drain region and said P channel region of said first NMOS transistor, said first Zener region of P type but more heavily doped than said P channel said first NMOS transistor to form a Zener diode having a Zener breakdown voltage less than the first protection diode breakdown voltage and greater than the reference voltage for coupling the first input/output terminal through the channel of the first NMOS transistor to the first reference voltage terminal during Zener breakdown.

9. The integrated circuit of claim 8, further comprising:

(a) a PNP bipolar transistor formed in aid semiconductor layer; and (b) wherein said first Zener region has the doping profile of a base of said PNP transistor.

10. The integrated circuit of claim 8, further comprising:

(a) a plurality of PMOS transistors formed in said semiconductor layer, said semiconductor layer having a second reference voltage terminal, said NMOS and PMOS transistors coupled to said first input/output terminal and to said first and second reference terminals, each of said PMOS transistors with a P+ source region, a P+ drain region, and a N channel region; and (b) a second ESD protection diode formed in said semiconductor layer and connected between said first input/output terminal and said second reference voltage terminal, said second ESD protection diode including a first PMOS transistor having a P+ source, a P+ drain, a N channel disposed between the source and drain, a gate disposed over the N channel and insulated therefrom, the source coupled to the input/output terminal, the drain coupled to the second reference voltage terminal, the gate and drain coupled together to form the second ESD protection diode, said second ESD protection diode having a protection diode breakdown voltage between the P+ drain and the N channel greater than the reference voltage;

(c) a second Zener region abutting both said P+ drain region and said N channel region of said first PMOS transistor, said second Zener region of N type but more heavily doped than said N channel said first PMOS transistor to form a Zener diode having a Zener breakdown voltage less than the second ESD protection diode breakdown voltage and greater than the second reference voltage for coupling the first input/output terminal through the N channel of the first PMOS transistor to the second reference voltage terminal during Zener breakdown.

11. The integrated circuit of claim 10, further comprising:

(a) a NPN bipolar transistor formed in said semiconductor layer; and (b) wherein said second Zener region has the doping profile of a base of said NPN transistor.

12. The integrated circuit of claim 10 further comprising:

(a) a third reference voltage terminal and (b) a third ESD protection diode coupled between said third reference voltage terminal and said first input/output terminal.

13. The circuit of claim 1 wherein the Zener diode is embedded in the drain region of said first transistor.

* * * * *